US010879230B2

(12) United States Patent
He et al.

(10) Patent No.: US 10,879,230 B2
(45) Date of Patent: Dec. 29, 2020

(54) SCHOTTKY INTEGRATED HIGH VOLTAGE TERMINATIONS AND RELATED HVIC APPLICATIONS

(71) Applicant: Infineon Technologies Americas Corp., El Segundo, CA (US)

(72) Inventors: Donald He, Redondo Beach, CA (US); Niraj Ranjan, El Segundo, CA (US); Siddharth Kiyawat, Kensington, CA (US); Min Fang, Manhattan Beach, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 760 days.

(21) Appl. No.: 15/185,433

(22) Filed: Jun. 17, 2016

(65) Prior Publication Data
US 2017/0365595 A1    Dec. 21, 2017

(51) Int. Cl.
*H01L 27/02* (2006.01)
*H01L 29/872* (2006.01)
*H01L 29/06* (2006.01)
*H01L 29/47* (2006.01)

(52) U.S. Cl.
CPC ........ *H01L 27/0255* (2013.01); *H01L 29/063* (2013.01); *H01L 29/0619* (2013.01); *H01L 29/872* (2013.01); *H01L 29/8725* (2013.01)

(58) Field of Classification Search
None
See application file for complete search history.

(56) References Cited

U.S. PATENT DOCUMENTS

| 6,597,550 | B1 | 7/2003 | Vukicevic et al. |
| 8,264,057 | B2* | 9/2012 | Shimizu .......... H01L 21/823481 257/488 |
| 8,957,494 | B2 | 2/2015 | Gu |
| 9,318,415 | B2* | 4/2016 | Gates ................. H01L 23/481 |
| 2006/0237815 | A1* | 10/2006 | Kim ................... H01L 27/0629 257/500 |
| 2010/0117725 | A1* | 5/2010 | Mauder ............. H01L 27/0676 327/587 |
| 2011/0095360 | A1* | 4/2011 | Krumrey ............ H01L 29/407 257/334 |

(Continued)

*Primary Examiner* — Eva Y Montalvo
*Assistant Examiner* — Kien C Ly
(74) *Attorney, Agent, or Firm* — Murphy, Bilak & Homilier, PLLC

(57) ABSTRACT

A Schottky diode includes a cathode terminal in a high voltage region of a semiconductor die, an anode terminal in a low voltage region of the semiconductor die, where the anode terminal and the cathode terminal are separated by a junction isolation termination situated between the high voltage region and the low voltage region. The Schottky diode includes a junction barrier Schottky diode or a trench metal-oxide-semiconductor (MOS) Schottky diode. The junction isolation termination includes pzener rings. The semiconductor die includes a substrate of a first conductivity type, an epitaxial layer of a second conductivity type situated on the substrate, a well region of the second conductivity type situated in the epitaxial layer in the high voltage region, and coupled to the cathode terminal, a Schottky barrier situated on the epitaxial layer in the low voltage region, and coupled to the anode terminal.

20 Claims, 13 Drawing Sheets

(56) References Cited

U.S. PATENT DOCUMENTS

| | | | |
|---|---|---|---|
| 2013/0056744 A1* | 3/2013 | Mishra | H01L 29/0619 257/76 |
| 2013/0075877 A1* | 3/2013 | Sakai | H01L 21/765 257/655 |
| 2013/0228891 A1* | 9/2013 | Kao | H01L 21/28008 257/494 |
| 2015/0359511 A1* | 12/2015 | Uchiumi | A61B 8/14 600/443 |

* cited by examiner

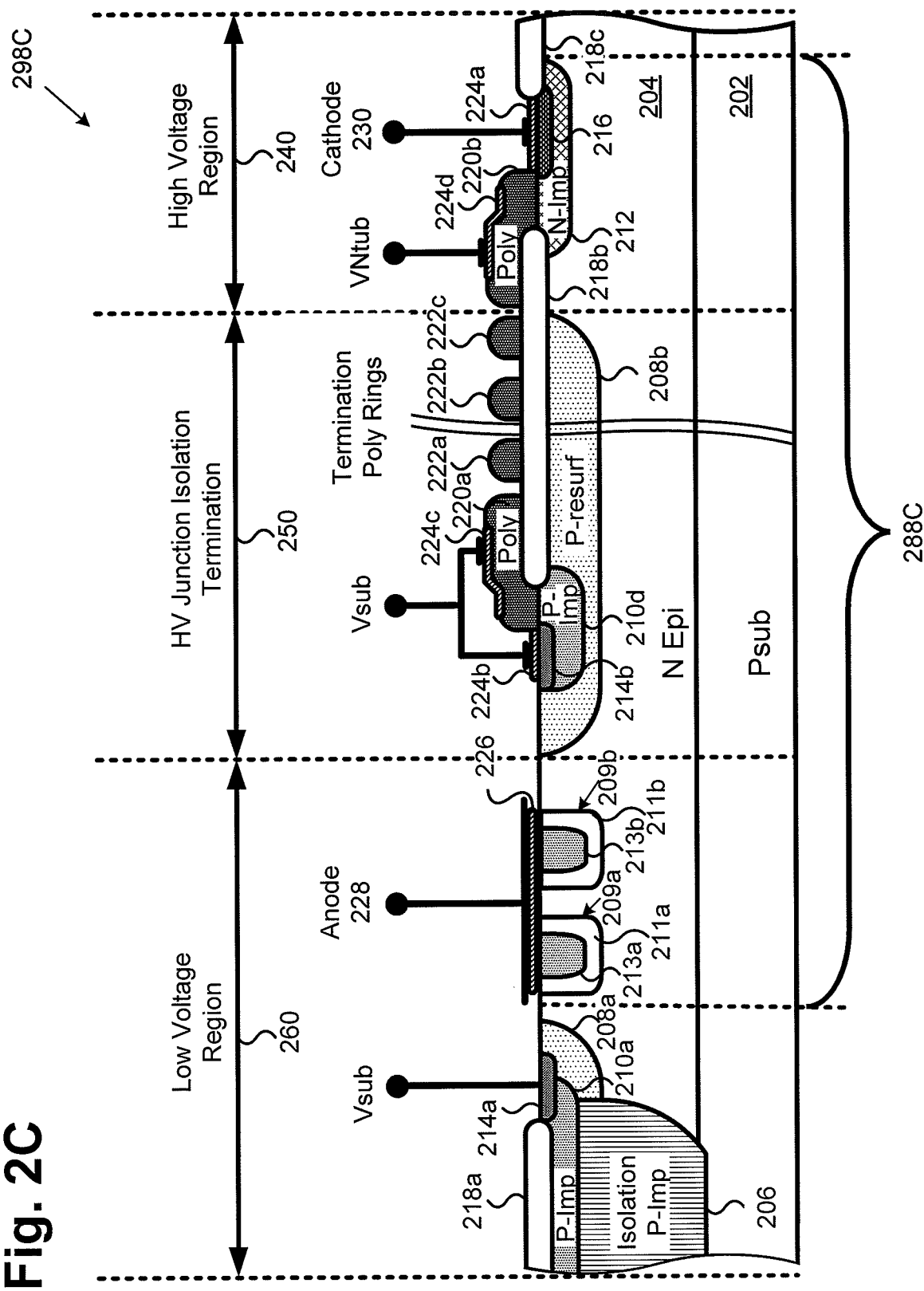

SCHOTTKY INTEGRATED HIGH VOLTAGE TERMINATIONS AND RELATED HVIC APPLICATIONS

BACKGROUND

Driver integrated circuits, such as high voltage integrated circuits (HVICs), can be utilized to drive power switches in half-bridge configurations to power circuits and devices, such as motors, actuators or the like. A bootstrap circuit having a bootstrap diode and a bootstrap capacitor can be implemented between the HVIC's power supply and a switched node of the half-bridge to improve performance characteristics, such as switching speed, of the power switches. In addition, a voltage clamping diode can be implemented between the switched node and a common ground node to prevent negative voltage spikes caused by the potential at the switched node becoming lower than the ground potential due to delay in the turn-on of a low-side free-wheel diode, for example. Conventionally, the bootstrap diode and the voltage clamping diode are external components to the HVIC, which adversely impact the size and performance of the HVIC.

Accordingly, there is a need to overcome the drawbacks and deficiencies in the art by providing a bootstrap Schottky diode and/or a voltage clamping Schottky diode monolithically integrated in an HVIC.

SUMMARY

The present disclosure is directed to Schottky integrated high voltage terminations and related HVIC applications, substantially as shown in and/or described in connection with at least one of the figures, and as set forth in the claims.

BRIEF DESCRIPTION OF THE DRAWINGS

FIG. 2C illustrates a cross sectional view of an exemplary monolithically integrated bootstrap Schottky diode, according to one implementation of the present application.

DETAILED DESCRIPTION

Figure 1A:
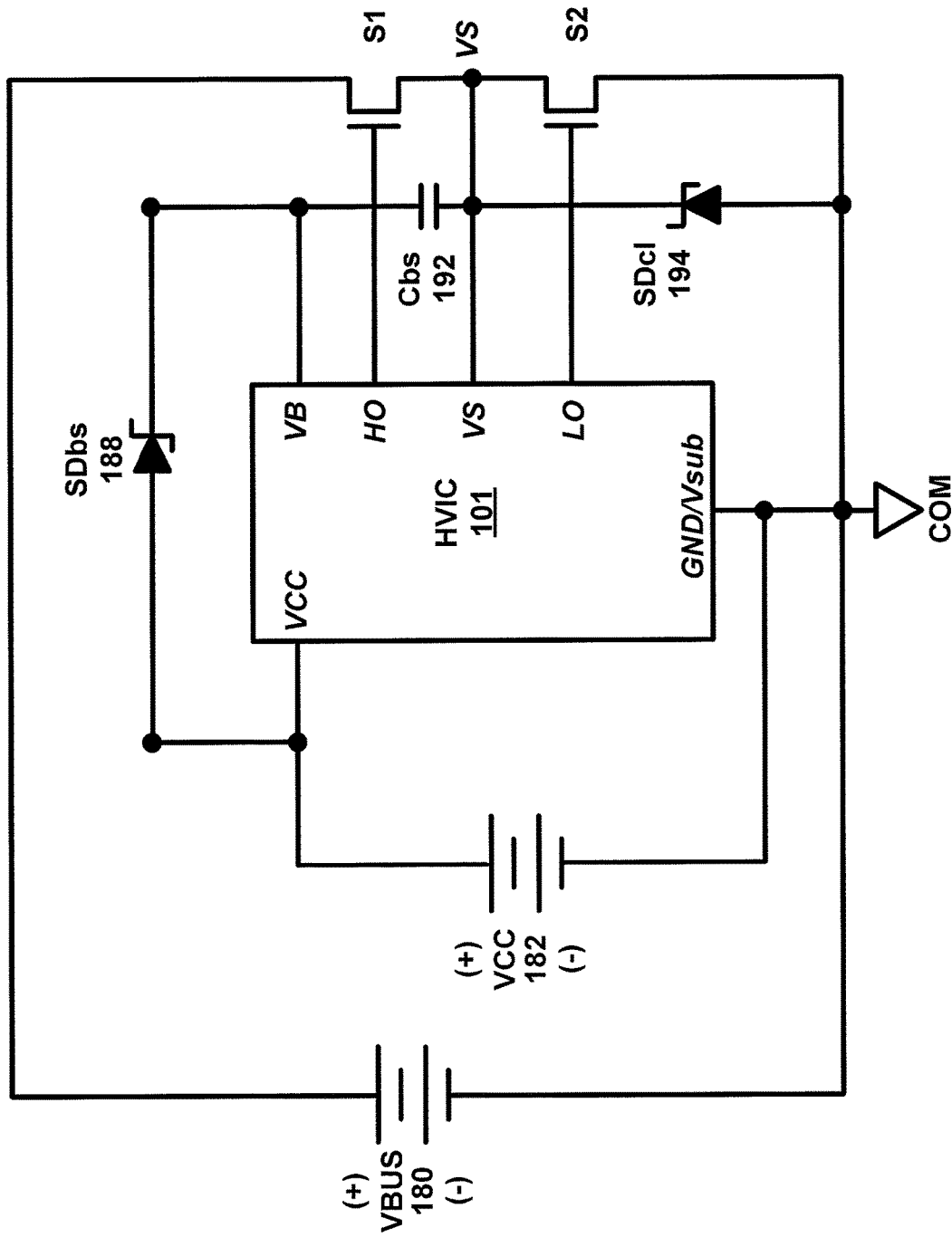
FIG. 1A illustrates an exemplary HVIC for driving a high-side switch and a low-side switch connected in a half-bridge configuration, according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

Referring to FIG. 1A, FIG. 1A illustrates an exemplary HVIC for driving a high-side switch and a low-side switch connected in a half-bridge configuration, according to one implementation of the present application. As illustrated in FIG. 1, circuit 100 includes HVIC 101, high-side switch S1, low-side switch S2, bootstrap Schottky diode (SDbs) 188, bootstrap capacitor (Cbs) 192, and voltage clamping Schottky diode (SDcl) 194.

As illustrated in FIG. 1A, HVIC 101 provides high-side control signal (HO) to a gate of high-side switch S1 to drive high-side switch S1. HVIC 101 also provides low-side control signal LO to a gate of low-side switch S2 to drive low-side switch S2. HVIC 101 may adjust the on-times of high-side switch S1 and low-side switch S2 to turn high-side switch S1 and low-side switch S2 ON and OFF in a complementary manner. As illustrated in FIG. 1A, high-side switch S1 and low-side switch S2 are connected at switched node VS in a half-bridge configuration. High-side switch S1 and low-side switch S2 are coupled between the positive and negative terminals of DC bus voltage supply 180, for example. In one implementation, high-side switch S1 and low-side switch S2 may each be, for example, a silicon field effect transistor (FET), such as a silicon metal-oxide semiconductor FET (MOSFET). In another implementation, high-side switch S1 and low-side switch S2 may each be a group III-V semiconductor device, such as, for example, a gallium nitride (GaN) device, which can be a GaN high electron mobility transistor (HEMT). In another implementation, high-side switch S1 and low-side switch S2 may be any other suitable switches, such as bipolar junction transistors (BJTs) and insulated gate bipolar transistors (IGBTs).

As illustrated in FIG. 1A, circuit 100 includes bootstrap Schottky diode (SDbs) 188 and bootstrap capacitor (Cbs)

192 coupled between positive terminal VCC(+) of power supply VCC 182 and switched node VS. The anode of bootstrap Schottky diode (SDbs) 188 is coupled to positive terminal VCC(+) of power supply VCC 182, and the cathode of bootstrap Schottky diode (SDbs) 188 is coupled to bootstrap capacitor (Cbs) 192 at terminal VB. Bootstrap capacitor (Cbs) 192 is coupled between the cathode of bootstrap Schottky diode (SDbs) 188 and switched node VS. For example, when a low voltage is applied to switched node VS, circuit 100 is configured to charge bootstrap capacitor (Cbs) 192 from positive terminal VCC(+) of power supply VCC 182 through bootstrap Schottky diode (SDbs) 188, and supply power to power supply terminal VB on a high voltage side. When a high voltage is applied to switched node VS, the voltage at switched node VS exceeds the voltage of positive terminal VCC(+) of power supply VCC 182 with the help of bootstrap capacitor (Cbs) 192, bootstrap Schottky diode (SDbs) 188 is in a reverse blocking state, while switched node VS attempts to supply power to a circuit on the high voltage side through bootstrap Schottky diode (SDbs) 188. It is desirable for bootstrap Schottky diode (SDbs) 188 to withstand high voltages in the reverse blocking state, and to recover quickly when forward biasing is need to charge bootstrap capacitor (Cbs) 192.

In addition, circuit 100 also includes voltage clamping Schottky diode (SDcl) 194 coupled between common ground node COM and switched node VS. As illustrated in FIG. 1A, the anode of voltage clamping Schottky diode (SDcl) 194 is connected to common ground node COM, while the cathode of voltage clamping Schottky diode (SCcl) 194 is connected to switched node VS. Voltage clamping Schottky diode (SCcl) 194 is configured to turn ON to supply current to switched node VS, when the voltage at switched node VS drops below zero. As such, voltage clamping Schottky diode (SCcl) 194 is configured to prevent the voltage at switched node VS from becoming negative.

In contrast to conventional HVICs where the voltage clamping diode and bootstrap diode are external diodes, according to implantations of the present application, bootstrap Schottky diode (SDbs) 188 and voltage clamping Schottky diode (SCcl) 194 are monolithically integrated in the semiconductor die, on which HVIC 101, high-side switch S1 and low-side switch S2 are formed.

Figure 1B:
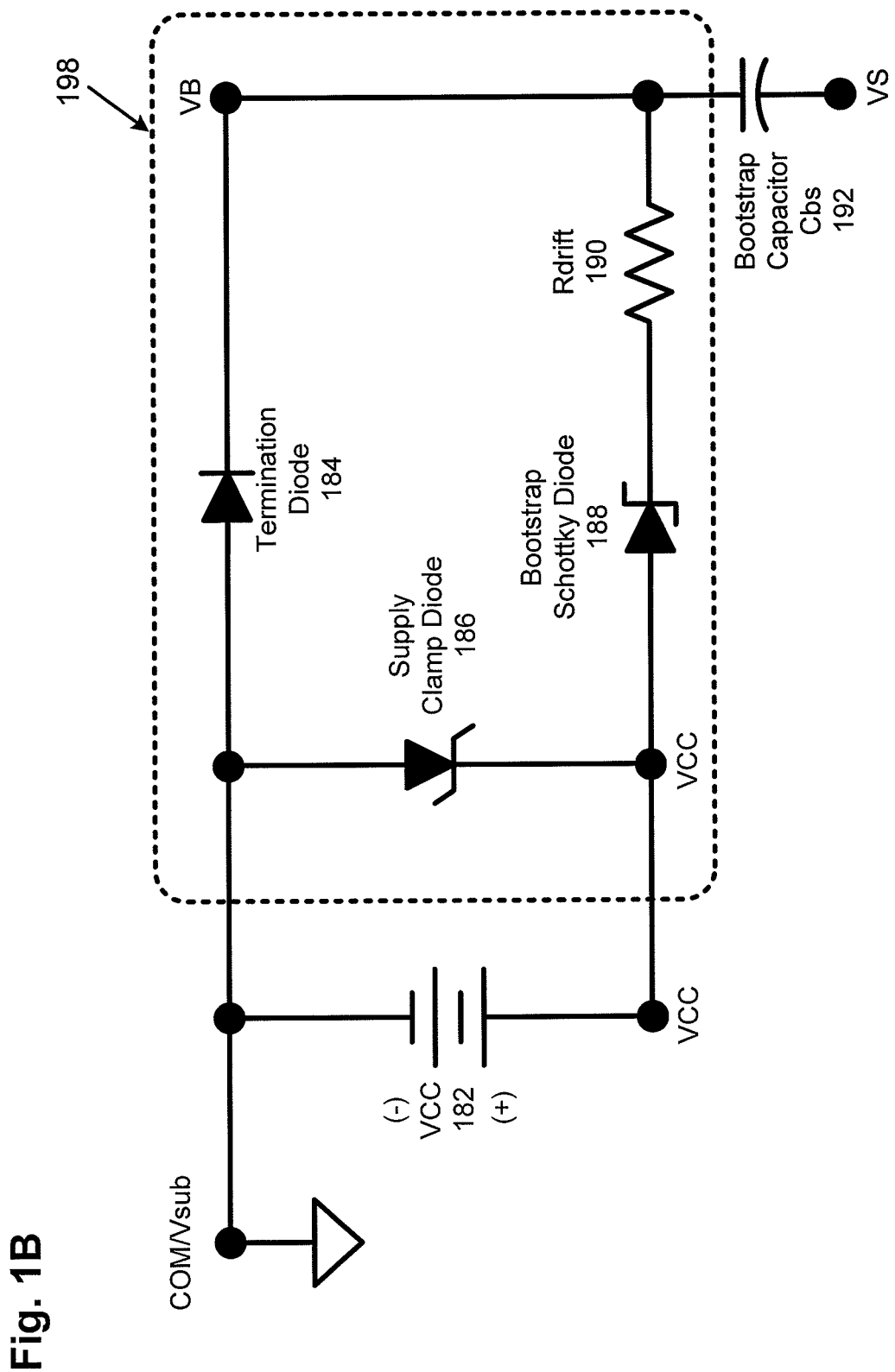
FIG. 1B illustrates an exemplary chip level schematic circuit diagram of a portion of an HVIC having a monolithically integrated bootstrap Schottky diode, according to one implementation of the present application.

Referring to FIG. 1B, FIG. 1B illustrates an exemplary chip level schematic circuit diagram of a portion of an HVIC having a monolithically integrated bootstrap Schottky diode, according to one implementation of the present application. In the present implementation, FIG. 1B illustrates a chip level schematic circuit diagram of a portion of circuit 100 in FIG. 1A. With similar numerals representing similar features in FIG. 1A, as illustrated in FIG. 1B, termination diode 184, supply clamp diode 186 and bootstrap Schottky diode (SDbs) 188 are monolithically integrated in semiconductor die 198.

As illustrated in FIG. 1B, bootstrap Schottky diode (SDbs) 188 and parasitic drift resistance 190 are connected in series, and coupled between positive terminal VCC(+) of power supply VCC 182 and terminal VB. The anode of bootstrap Schottky diode (SDbs) 188 is coupled to positive terminal VCC(+) of power supply VCC 182, and the cathode of bootstrap Schottky diode (SDbs) 188 is coupled to bootstrap capacitor (Cbs) 192 at terminal VB. Parasitic drift resistance 190 may be present between the cathode of bootstrap Schottky diode (SDbs) 188 and terminal VB on semiconductor die 198. Bootstrap capacitor (Cbs) 192 is coupled between the cathode of bootstrap Schottky diode (SDbs) 188 at terminal VB and switched node VS. In the present implementation, bootstrap capacitor (Cbs) 192 is an external capacitor coupled to semiconductor die 198 at terminal VB.

As illustrated in FIG. 1B, termination diode 184 is coupled between common ground node COM/Vsub and terminal VB. The anode of termination diode 184 is coupled to common ground node COM/Vsub, and the cathode of termination diode 184 is coupled to terminal VB. Termination diode 184 may be a result of a p-n junction in semiconductor die 198, as will be discussed in detail below. Supply clamp diode 186 is coupled in parallel with power supply VCC 182, where the anode of supply clamp diode 186 is coupled to negative terminal VCC(−) of power supply VCC 182, and the cathode of supply clamp diode 186 is coupled to positive terminal VCC(+) of power supply VCC 182. In the present implementation, the anode of termination diode 184, the anode of supply clamp diode 186 and negative terminal VCC(−) are coupled to common ground node COM/Vsub, which may be a substrate voltage of semiconductor die 198.

Figure 2A:
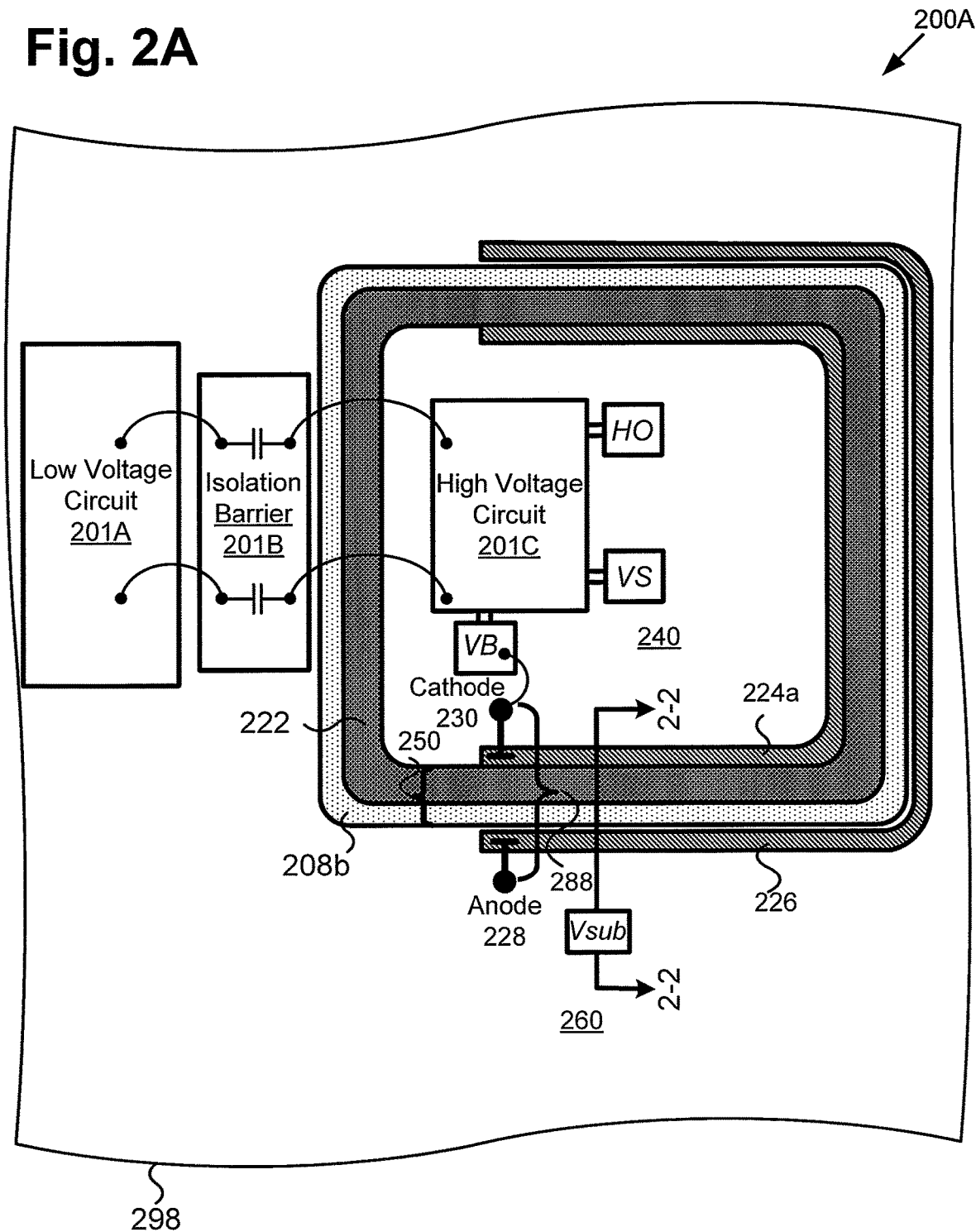
FIG. 2A illustrates an exemplary chip layout diagram of an HVIC having a monolithically integrated bootstrap Schottky diode, according to one implementation of the present application.

Referring to FIG. 2A, FIG. 2A illustrates an exemplary chip layout diagram of an HVIC having a monolithically integrated bootstrap Schottky diode, according to one implementation of the present application. In the present implementation, chip layout diagram 200A includes low voltage circuit 201A in low voltage region 260, isolation barrier 201B in low voltage region 260, high voltage circuit 201C in high voltage region 240, where low voltage region 260 is monolithically integrated with high voltage region 240 in semiconductor die 298. High voltage region 240 is structurally isolated from low voltage region 260 by high voltage junction isolation termination (HVJIT) 250. As illustrated in FIG. 2A, Low voltage circuit 201A is coupled to high voltage circuit 201C through capacitive isolation barrier 201B, where low voltage circuit 201A, capacitive isolation barrier 201B and high voltage circuit 201C are part of an HVIC, such as HVIC 101 in FIG. 1A.

As illustrated in FIG. 2A, bootstrap Schottky diode 288 is monolithically integrated in semiconductor die 298 along HVJIT 250, which includes P-type reduced surface field (RESURF) region 208b and termination rings 222. As illustrated in FIG. 2A, anode terminal 228 of bootstrap Schottky diode 288 is situated in low voltage region 260 along the outer perimeters of HVJIT 250. Cathode terminal 230 of bootstrap Schottky diode 288 is situated in high voltage region 240 along the inner perimeters of HVJIT 250. In the present implementation, bootstrap Schottky diode 288 is monolithically integrated along the top, right and bottom sides of HVJIT 250. In another implementation, bootstrap Schottky diode 288 may be monolithically integrated along all four sides of HVJIT 250. In the present implementation, anode terminal 228 is coupled to, for example, positive terminal VCC(+) of power supply VCC, not explicitly shown in FIG. 2A. In the present implementation, cathode terminal 230 is coupled to terminal VB of high voltage circuit 201C. Bootstrap Schottky diode 288 is configured to charge a bootstrap capacitor, such as bootstrap capacitor (Cbs) 192 in FIG. 1B, at terminal VB.

Figure 2B:
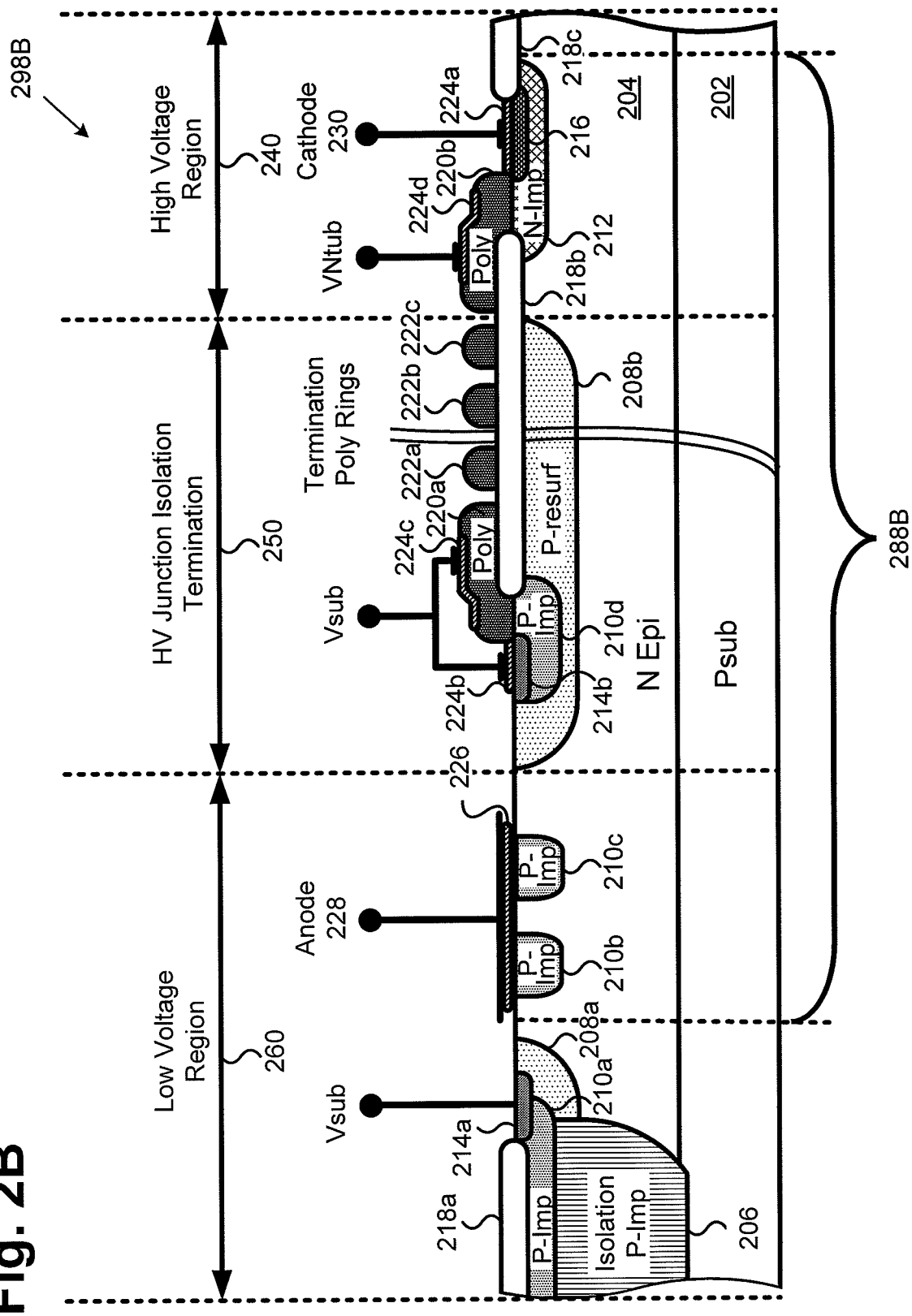
FIG. 2B illustrates a cross sectional view of an exemplary monolithically integrated bootstrap Schottky diode, according to one implementation of the present application.

Referring to FIG. 2B, FIG. 2B illustrates a cross sectional view of an exemplary monolithically integrated bootstrap Schottky diode, according to one implementation of the present application. In the present implementation, FIG. 2B illustrates a cross sectional view of a monolithically integrated bootstrap Schottky diode along line 2-2 of FIG. 2A. As illustrated in FIG. 2B, semiconductor die 298B includes P-type substrate 202, N-type epitaxial layer 204, P-type isolation region 206, P-type RESURF regions 208a and 208b, P-type implant regions 210a, 210b, 210c and 210d, N-type implant region 212, P-type contact regions 214a and 214b, N-type cathode contact region 216, field oxide regions 218a, 218b and 218c, low-voltage tie region 220a, high-voltage tie region 220b, termination rings 222a, 222b and 222c, cathode ohmic layer 224a, ohmic layers 224b, 224c and 224d, anode Schottky barrier 226, anode terminal 228, and cathode terminal 230.

As illustrated in FIG. 2B, N-type epitaxial layer 204 is situated over a top surface of P-type substrate 202. Semiconductor die 298B includes low voltage region 260, high voltage junction isolation termination (HVJIT) 250, and high voltage region 240, where high voltage region 240 is structurally isolated from low voltage region 260 by HVJIT 250. As can be seen in FIG. 2A, high voltage region 240 is an isolated high voltage well region (e.g., a high voltage N-tub) in N-type epitaxial layer 204, and surrounded by HVJIT 250 and isolated from low voltage region 260.

As illustrated in FIG. 2B, in low voltage region 260, substrate contact Vsub is coupled to P-type substrate 202 through P-type contact region 214a, P-type implant region 210a, P-type RESURF region 208a, and P-type isolation region 206. Low voltage region 260 also includes P-type implant regions 210b and 210c, which are ion implanted regions in N-type epitaxial layer 204 in low voltage region 260 along the outer perimeters of HVJIT 250. For example, P-type implant regions 210b and 210c are two substantially parallel strips along the outer perimeters of HVJIT 250 under anode Schottky barrier 226 shown in FIG. 2A. P-type implant regions 210b and 210c are configured to reduce leakage current under anode Schottky barrier 226.

As illustrated in FIG. 2B, HVJIT 250 includes P-type RESURF region 208b in N-type epitaxial layer 204, field oxide region 218b over P-type RESURF region 208b, and termination rings 222a, 222b and 222c (e.g., pzener rings) situated over field oxide region 218b. HVJIT 250 also includes P-type contact region 214b situated in P-type implant region 210d in P-type RESURF region 208b, and low-voltage tie region 220a situated partially over field oxide region 218b and partially over P-type implant region 210d, where ohmic layer 224b over P-type contact region 214b and ohmic layer 224c over low-voltage tie region 220a are coupled to substrate contact Vsub.

As illustrated in FIG. 2B, high voltage region 240 includes N-type cathode contact region 216 situated in N-type implant region 212, which is situated in N-type epitaxial layer 204. N-type implant region 212 is an ion implanted region in N-type epitaxial layer 204 in high voltage region 240 along the inner perimeters of HVJIT 250. Cathode ohmic layer 224a is situated on N-type cathode contact region 216, and coupled to cathode terminal 230. As illustrated in FIG. 2B, high voltage region 240 also includes high-voltage tie region 220b situated partially over field oxide region 218b and partially over N-type implant region 212, where ohmic layer 224d over high-voltage tie region 220b is VNtub coupled to N-tub contact VNtub.

As illustrated in FIG. 2B, bootstrap Schottky diode 288B, which may correspond to bootstrap Schottky diode (SDbs) 188 in FIGS. 1A and 1B, is monolithically integrated in semiconductor die 298B. Bootstrap Schottky diode 288B includes anode terminal 228 in low voltage region 260 and cathode terminal 230 in high voltage region 240, where high voltage region 240 is isolated from low voltage region 260 by HVJIT 250. It should be understood that high voltage region 240 is surrounded by HVJIT 250, as illustrated in FIG. 2A.

As illustrated in FIG. 2B, N-type implant region 212 is formed in the top surface of N-type epitaxial layer 204 in high voltage region 240 adjacent HVJIT 250. N-type cathode contact region 216 is of N+ conductivity type formed in N-type implant region 212, and coupled to cathode ohmic layer 224a. Cathode ohmic layer 224a may include an ohmic metal, such as nickel (Ni), nickel silicide (NiSi), or nickel aluminide (NiAl). Cathode terminal 230 is formed on cathode ohmic layer 224a.

P-type implant regions 210b and 210c are formed in the top surface of N-type epitaxial layer 204 in low voltage region 260 outside of HVJIT 250. Anode Schottky barrier 226 is formed over P-type implant regions 210b and 210c and coupled to anode terminal 228 of bootstrap Schottky diode 288B. In the present implantation, anode Schottky barrier 226 may include a silicide layer, such as a platinum-silicide layer. In another implantation, anode Schottky barrier 226 may include other silicides and metals such as aluminum or titanium. Anode terminal 228 is formed on anode Schottky barrier 226. It should be understood that, in the present implementation, bootstrap Schottky diode 288B is a junction barrier bootstrap Schottky diode.

The portion of N-type epitaxial layer 204 under HVJIT 250 between N-type implant region 212 and N-type implant regions 210b and 210c provides a lateral drift region for bootstrap Schottky diode 288B, so that bootstrap Schottky diode 288B can withstand a high voltage of at least 600 volts under reverse bias. In the present implementation, anode terminal 228 of bootstrap Schottky diode 288B is tied to positive terminal VCC (+) in low voltage region 260, while cathode terminal 230 of bootstrap Schottky diode 288B is tied to terminal VB of high voltage region 240 to charge a bootstrap capacitor, not explicitly shown in FIG. 2B. The drift region under HVJIT 250 has a parasitic drift resistance Rdrift, which may correspond to parasitic drift resistance 190 in FIG. 1B. In contrast to conventional Schottky diodes that require buried layers in an epitaxial layer under both anode and cathode terminals, bootstrap Schottky diode 288B utilizes epitaxial layer 204 under HVJIT 250 as a lateral drift region without the need to form any buried layer, thereby simplifying manufacturing process.

In operation, when bootstrap Schottky diode 288B is under reverse bias, the lateral drift region under HVJIT 250 is configured to withstand a reverse bias voltage of at least 600 volts to substantially isolate cathode terminal 230 from anode terminal 228. Thus, the portion of N-type epitaxial layer 204 under HVJIT 250 is utilized to provide reverse bias voltage blocking capability for bootstrap Schottky diode 288B. When bootstrap Schottky diode 288B is under forward bias, the voltage drop between anode terminal 228 and cathode terminal 230 of bootstrap Schottky diode 288B is small, thereby allowing bootstrap Schottky diode 288B to recover quickly from a reverse bias condition to conduct current from anode terminal 228 to cathode terminal 230 to charge the bootstrap capacitor (e.g., bootstrap capacitor 192 in FIG. 1B). In one implementation, bootstrap Schottky diode 288B may have a switching frequency of at least 100 kHz.

In addition, a termination diode (e.g., termination diode 184 in FIG. 1B) is formed in high voltage region 240 in semiconductor die 298. The termination diode is a p-n junction diode within high voltage region 240, where the anode of the termination diode is coupled to P-type substrate 202, while the cathode of the termination diode shares the same cathode terminal with bootstrap Schottky diode 288B, which is coupled to terminal VB. Thus, semiconductor die 298 includes a monolithically integrated bootstrap Schottky diode and a p-n junction termination diode therein.

Referring to FIG. 2C, FIG. 2C illustrates a cross sectional view of an exemplary monolithically integrated bootstrap Schottky diode, according to one implementation of the present application. With similar numerals representing similar features in semiconductor die 298B in FIG. 2B, semiconductor die 298C includes P-type substrate 202, N-type epitaxial layer 204, P-type isolation region 206, P-type RESURF regions 208a and 208b, P-type implant regions 210a and 210d, N-type implant region 212, P-type contact regions 214a and 214b, N-type cathode contact region 216, field oxide regions 218a, 218b and 218c, low-voltage tie region 220a, high-voltage tie region 220b, termination rings 222a, 222b and 222c, cathode ohmic layer 224a, ohmic layers 224b, 224c and 224d, anode Schottky barrier 226, anode terminal 228, and cathode terminal 230.

In contrast to bootstrap Schottky diode 288B in semiconductor die 298B shown in FIG. 2B, bootstrap Schottky diode 288C in FIG. 2C is a trench metal-oxide-semiconductor barrier Schottky (TMBS) diode. Thus, instead of having P-type implant regions 210b and 210c under anode Schottky barrier 226 to form a junction barrier Schottky (JBS) diode in FIG. 2B, bootstrap Schottky diode 288C in FIG. 2C includes trenches 209a and 209b under anode Schottky barrier 226, where trench 209a includes conductive filler 213a in dielectric liner 211a, and trench 209b includes conductive filler 213b in dielectric liner 211b. The fabrication process of forming trenches 209a and 209b, as well as conductive fillers 213a and 213b, can be well controlled to reduce the dimensions of trenches 209a and 209b and conductive fillers 213a and 213b in N-type epitaxial layer 204, thereby saving space on semiconductor die 298C. Also, trenches 209a and 209b can better limit the leakage current of bootstrap Schottky diode 288C under anode Schottky barrier 226, since the distance between trenches 209a and 209b can be better controlled as compared to ion implanted regions in junction barrier Schottky diodes. Similar to bootstrap Schottky diode 288B in FIG. 2B, bootstrap Schottky diode 288C in FIG. 2C has a reverse voltage blocking capability of at least 600 volts, and a switching frequency of at least 100 kHz.

Figure 3:
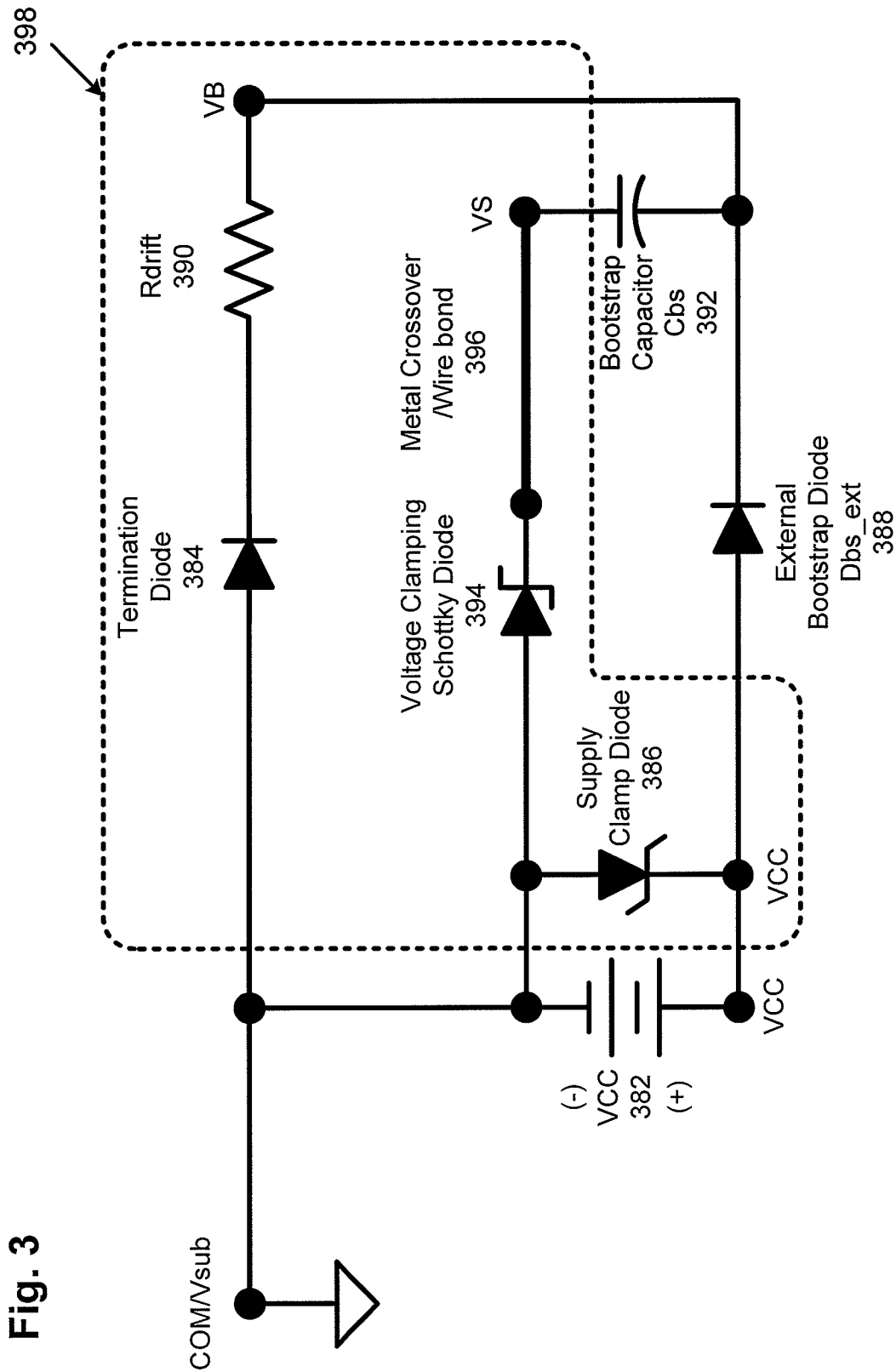
FIG. 3 illustrates an exemplary chip level schematic circuit diagram of a portion of an HVIC having a monolithically integrated voltage clamping Schottky diode, according to one implementation of the present application.

Referring to FIG. 3, FIG. 3 illustrates an exemplary chip level schematic circuit diagram of a portion of an HVIC having a monolithically integrated voltage clamping Schottky diode, according to one implementation of the present application. In the present implementation, FIG. 3 illustrates a chip level schematic circuit diagram of a portion of circuit 100 in FIG. 1A. With similar numerals representing similar features in FIG. 1A, as illustrated in FIG. 3, termination diode 384, supply clamp diode 386 and voltage clamping Schottky diode 394 are monolithically integrated in semiconductor die 398. In addition, power supply VCC 382 is coupled to semiconductor die 398 between positive terminal VCC(+) and negative terminal VCC(−). External bootstrap diode (Dbs_ext) 388 is coupled to semiconductor die 398 between positive terminal VCC(+) and terminal VB. Bootstrap capacitor (Cbs) 392 is coupled to semiconductor die 398 between switched node VS and terminal VB.

As illustrated in FIG. 3, termination diode 384 and parasitic drift resistance 390 are connected in series, and coupled between negative terminal VCC(−) of power supply VCC 382 and terminal VB. The anode of termination diode 384 is coupled to VCC(−) of power supply VCC 382, and the cathode of termination diode 384 is coupled to bootstrap capacitor (Cbs) 392 at terminal VB. Parasitic drift resistance 390 may be present between the cathode of termination diode 384 and terminal VB in semiconductor die 398. Bootstrap capacitor (Cbs) 392 is coupled between the cathode of external bootstrap diode (Dbs_ext) 388 at terminal VB and switched node VS. In the present implementation, bootstrap capacitor (Cbs) 392 is an external capacitor coupled to semiconductor die 398 between terminal VB and switched node VS. Supply clamp diode 386 is coupled in parallel with power supply VCC 382, where the anode of supply clamp diode 386 is coupled to negative terminal VCC(−) of power supply VCC 382, and the cathode of supply clamp diode 386 is coupled to positive terminal VCC(+) of power supply VCC 382. In the present implementation, the anode of termination diode 384, the anode of supply clamp diode 386, the anode of voltage clamping Schottky diode 394, and negative terminal VCC(−) are coupled to common ground node COM/Vsub, which may be a substrate voltage of semiconductor die 398.

As illustrated in FIG. 3, external bootstrap diode (Dbs_ext) 388 and bootstrap capacitor (Cbs) 392 are external to semiconductor die 398, and are coupled between positive terminal VCC(+) of power supply VCC 382 and switched node VS. The anode of external bootstrap diode (Dbs_ext) 388 is coupled to positive terminal VCC(+) of power supply VCC 382, and the cathode of external bootstrap diode (Dbs_ext) 388 is coupled to bootstrap capacitor (Cbs) 392 at terminal VB. Bootstrap capacitor (Cbs) 392 is coupled between the external bootstrap diode (Dbs_ext) 388 and switched node VS, where the cathode of voltage clamping Schottky diode 394 is coupled to switched node VS through metal crossover or wire bond 396. Voltage clamping Schottky diode 394 is monolithically integrated in semiconductor die 398, and coupled between negative terminal VCC(−) of power supply VCC and switched node VS. The anode of voltage clamping Schottky diode 394 is coupled to negative terminal VCC(−) of power supply VCC 382, and the cathode of voltage clamping Schottky diode 394 is coupled to switched node VS through metal crossover or wire bond 396.

As illustrated in FIG. 3, the anode of voltage clamping Schottky diode 394 is connected to common ground node COM/Vsub, while the cathode of voltage clamping Schottky diode 394 is connected to switched node VS. Voltage clamping Schottky diode 394 is configured to turn ON to supply current to switched node VS, when the voltage at switched node VS drops below zero. As such, voltage clamping Schottky diode 394 is configured to prevent the voltage at switched node VS from becoming negative.

External bootstrap diode (Dbs_ext) 388 is configured to charge bootstrap capacitor (Cbs) 392 from positive terminal VCC(+) of power supply VCC 382. When a high voltage is applied to switched node VS, the voltage at switched node VS exceeds the voltage of positive terminal VCC(+) of power supply VCC 382 with the help of bootstrap capacitor (Cbs) 392, external bootstrap diode (Dbs_ext) 388 is in a reverse blocking state, while switched node VS attempts to supply power to a circuit on the high voltage side through external bootstrap diode (Dbs_ext) 388.

Figure 4A:
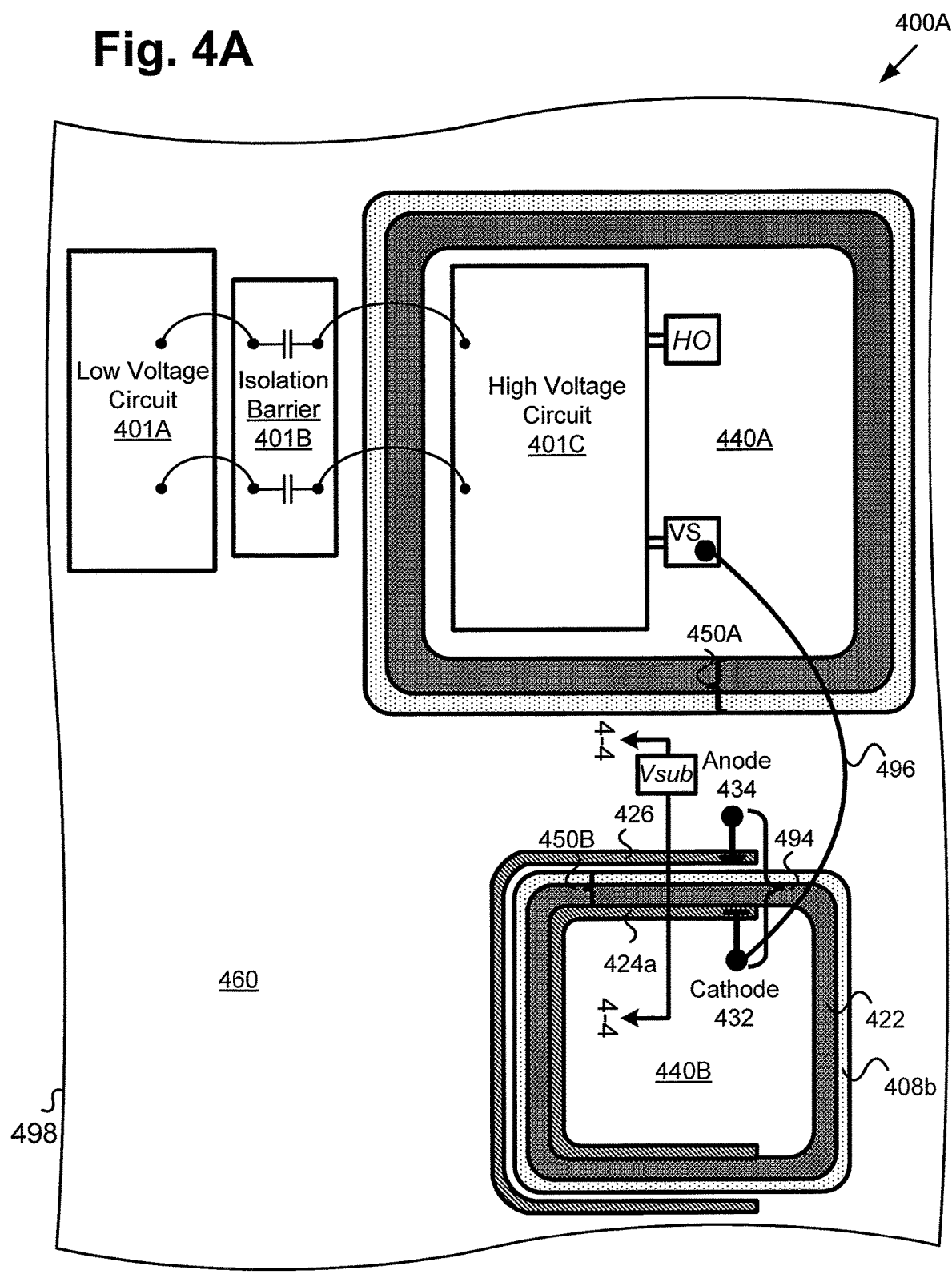
FIG. 4A illustrates an exemplary chip layout diagram of an HVIC having a monolithically integrated voltage clamping Schottky diode according to one implementation of the present application.

Referring to FIG. 4A, FIG. 4A illustrates an exemplary chip layout diagram of an HVIC having a monolithically integrated voltage clamping Schottky diode according to one implementation of the present application. With similar numerals representing similar features in FIG. 1A, chip layout diagram 400A in FIG. 4A includes low voltage circuit 401A in low voltage region 460, capacitive isolation barrier 401B in low voltage region 460, high voltage circuit 401C in high voltage region 440A, where low voltage region 460 is monolithically integrated with high voltage region 440A in semiconductor die 498. High voltage region 440A is structurally isolated from low voltage region 460 by high voltage junction isolation termination (HVJIT) 450A. Low voltage circuit 401A is coupled to high voltage circuit 401C through capacitive isolation barrier 401B, where low voltage circuit 401A, capacitive isolation barrier 401B and high voltage circuit 401C are part of an HVIC, such as HVIC 101 in FIG. 1A. High voltage region 440B is situated laterally adjacent to high voltage region 440A, and monolithically integrated with low voltage region 460 in semiconductor die 498. High voltage region 440B is structurally isolated from low voltage region 460 by high voltage junction isolation termination (HVJIT) 450B.

As illustrated in FIG. 4A, voltage clamping Schottky diode 494 is monolithically integrated in semiconductor die 498 along HVJIT 450B, which includes P-type reduced surface field (RESURF) region 408*b* and termination rings 422 (e.g., pzener rings). As illustrated in FIG. 4A, anode terminal 434 of voltage clamping Schottky diode 494 is situated in low voltage region 460 along the outer perimeters of HVJIT 450B. Cathode terminal 432 of voltage clamping Schottky diode 494 is situated in high voltage region 440B along the inner perimeters of HVJIT 450B. In the present implementation, voltage clamping Schottky diode 494 is formed along the top, left and bottom sides of HVJIT 450B. In another implementation, voltage clamping Schottky diode 494 may be monolithically integrated along all four sides of HVJIT 450B. In the present implementation, anode terminal 434 is coupled to, for example, common ground node COM/Vsub. In the present implementation, cathode terminal 432 is coupled to terminal VS of high voltage circuit 401C in high voltage region 440A through metal crossover or wire bond 496. Voltage clamping Schottky diode 494 is configured to turn ON to supply current to switched node VS, when the voltage at switched node VS drops below zero. As such, voltage clamping Schottky diode 494 is configured to prevent the voltage at switched node VS from becoming negative.

Figure 4B:
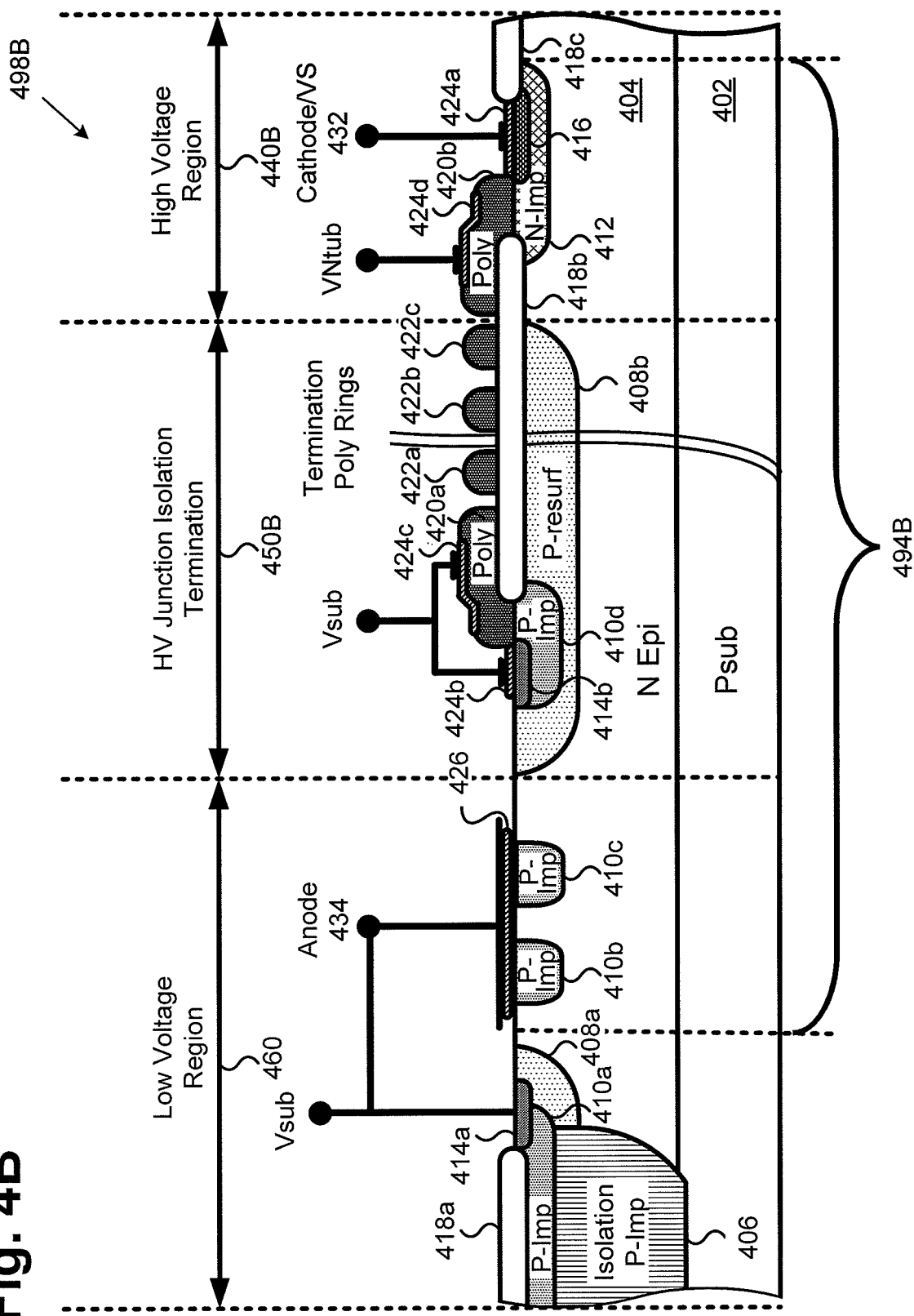
FIG. 4B illustrates a cross sectional view of an exemplary monolithically integrated voltage clamping Schottky diode, according to one implementation of the present application.

Referring to FIG. 4B, FIG. 4B illustrates a cross sectional view of an exemplary monolithically integrated voltage clamping Schottky diode, according to one implementation of the present application. In the present implementation, FIG. 4B illustrates a cross sectional view of a monolithically integrated bootstrap Schottky diode along line 4-4 of FIG. 4A. As illustrated in FIG. 4B, semiconductor die 498B includes P-type substrate 402, N-type epitaxial layer 404, P-type isolation region 406, P-type RESURF regions 408*a* and 408*b*, P-type implant regions 410*a*, 410*b*, 410*c* and 410*d*, N-type implant region 412, P-type contact regions 414*a* and 414*b*, N-type cathode contact region 416, field oxide regions 418*a*, 418*b* and 418*c*, low-voltage tie region 420*a*, high-voltage tie region 420*b*, termination rings 422*a*, 422*b* and 422*c*, cathode ohmic layer 424*a*, ohmic layers 424*b*, 424*c* and 424*d*, anode Schottky barrier 426, anode terminal 434, and cathode terminal 432.

As illustrated in FIG. 4B, N-type epitaxial layer 404 is situated over a top surface of P-type substrate 402. Semiconductor die 498B includes low voltage region 460, high voltage junction isolation termination (HVJIT) 450B, and high voltage region 440B, where high voltage region 440B is structurally isolated from low voltage region 460 by HVJIT 450B. As can be seen in FIG. 4A, high voltage region 440B is an isolated high voltage well region (e.g., a high voltage N-tub) in N-type epitaxial layer 404, and surrounded by HVJIT 450B and isolated from low voltage region 460.

As illustrated in FIG. 4B, in low voltage region 460, substrate contact Vsub is coupled to P-type substrate 402 through P-type contact region 414*a*, P-type implant region 410*a*, P-type RESURF region 408*a*, and P-type isolation region 406. Low voltage region 460 also includes P-type implant regions 410*b* and 410*c*, which are ion implanted regions in N-type epitaxial layer 404 in low voltage region 460 along the outer perimeters of HVJIT 450B. For example, P-type implant regions 410*b* and 410*c* are two substantially parallel strips along the outer perimeters of HVJIT 450B under anode Schottky barrier 426 shown in FIG. 4A. P-type implant regions 410*b* and 410*c* are configured to reduce leakage current under anode Schottky barrier 426.

As illustrated in FIG. 4B, HVJIT 450B includes P-type RESURF region 408*b* in N-type epitaxial layer 404, field oxide region 418*b* over P-type RESURF region 408*b*, and termination rings 422*a*, 422*b* and 422*c* (e.g., pzener rings) formed over field oxide region 418*b*. HVJIT 450B includes P-type contact region 414*b* situated in P-type implant region 410*d* in P-type RESURF region 408*b*, and low-voltage tie region 420*a* situated partially over field oxide region 418*b* and partially over P-type implant region 410*d*, where ohmic layer 424*b* over P-type contact region 414*b* and ohmic layer 424*c* over low-voltage tie region 420*a* are coupled to substrate contact Vsub.

As illustrated in FIG. 4B, high voltage region 440B includes N-type cathode contact region 416 situated in N-type implant region 412, which is situated in N-type epitaxial layer 404. N-type implant region 412 is an ion implanted region in N-type epitaxial layer 404 in high voltage region 440B along the inner perimeters of HVJIT 450. Cathode ohmic layer 424*a* is situated on N-type cathode contact region 416, and coupled to cathode terminal 432. As illustrated in FIG. 4B, high voltage region 440B also includes high-voltage tie region 420*b* situated partially over field oxide region 418*b* and partially over N-type implant region 412, where ohmic layer 424*d* over high-voltage tie region 420*b* is coupled to N-tub contact VNtub.

As illustrated in FIG. 4B, voltage clamping Schottky diode 494B, which may correspond to voltage clamping Schottky diode 194 in FIGS. 1A and 1B, is monolithically integrated in semiconductor die 498B. Voltage clamping Schottky diode 494B includes anode terminal 434 in low voltage region 460 and cathode terminal 432 in high voltage region 440B, where high voltage region 440B is isolated from low voltage region 460 by HVJIT 450B. It should be understood that high voltage region 440B is surrounded by HVJIT 450B, as illustrated in FIG. 4A.

As illustrated in FIG. 4B, N-type implant region 412 is implanted in N-type epitaxial layer 404 in high voltage region 440B adjacent HVJIT 450B. N-type cathode contact region 416 is of N+ conductivity type formed in N-type implant region 412, and coupled to cathode ohmic layer 424*a*. Cathode ohmic layer 424*a* may include an ohmic metal, such as nickel (Ni), nickel silicide (NiSi), or nickel aluminide (NiAl). Cathode terminal 432 is formed on cathode ohmic layer 424*a*, and coupled to switched node VS.

P-type implant regions 410*b* and 410*c* are formed in the top surface of N-type epitaxial layer 404 in low voltage region 460 outside of HVJIT 450B. Anode Schottky barrier 426 is formed over P-type implant regions 410*b* and 410*c* and coupled to anode terminal 434 of voltage clamping Schottky diode 494B. In the present implantation, anode Schottky barrier 426 may include a silicide layer, such as a platinum-silicide layer. In another implantation, anode Schottky barrier 426 may include other silicides and metals such as aluminum or titanium. Anode terminal 434 is formed on anode Schottky barrier 426, and coupled to common ground node COM/Vsub. It should be understood that, in the present implementation, voltage clamping Schottky diode 494B is a junction barrier voltage clamping Schottky diode.

In the present implementation, anode terminal 434 of voltage clamping Schottky diode 494B is tied to negative terminal VCC (−) in low voltage region 460, while cathode terminal 432 of voltage clamping Schottky diode 494B is tied to switched node VS. The portion of N-type epitaxial layer 404 under HVJIT 450B between N-type implant region 412 and N-type implant regions 410b and 410c provides a lateral drift region for voltage clamping Schottky diode 494B, so that voltage clamping Schottky diode 494B can withstand a high voltage of at least 600 volts under reverse bias. In contrast to conventional Schottky diodes that require buried layers in an epitaxial layer under both anode and cathode terminals, voltage clamping Schottky diode 494B utilizes epitaxial layer 404 under HVJIT 450B as a lateral drift region without the need to form any buried layer, thereby simplifying manufacturing process.

In operation, when voltage clamping Schottky diode 494B is under reverse bias, the lateral drift region under HVJIT 450B is configured to withstand a reverse bias voltage of at least 600 volts to substantially isolate cathode terminal 432 from anode terminal 434. Thus, the portion of N-type epitaxial layer 404 under HVJIT 450B is utilized to provide reverse bias voltage blocking capability for bootstrap Schottky diode 488. When the voltage at switched node VS drops below zero (i.e., become a negative potential), voltage clamping Schottky diode 494B is forward biased and configured to supply current to switched node VS. As such, voltage clamping Schottky diode 494B is configured to prevent the voltage at switched node VS from becoming negative. In one implementation, voltage clamping Schottky diode 494B may have a switching frequency of at least 100 kHz.

Figure 4C:
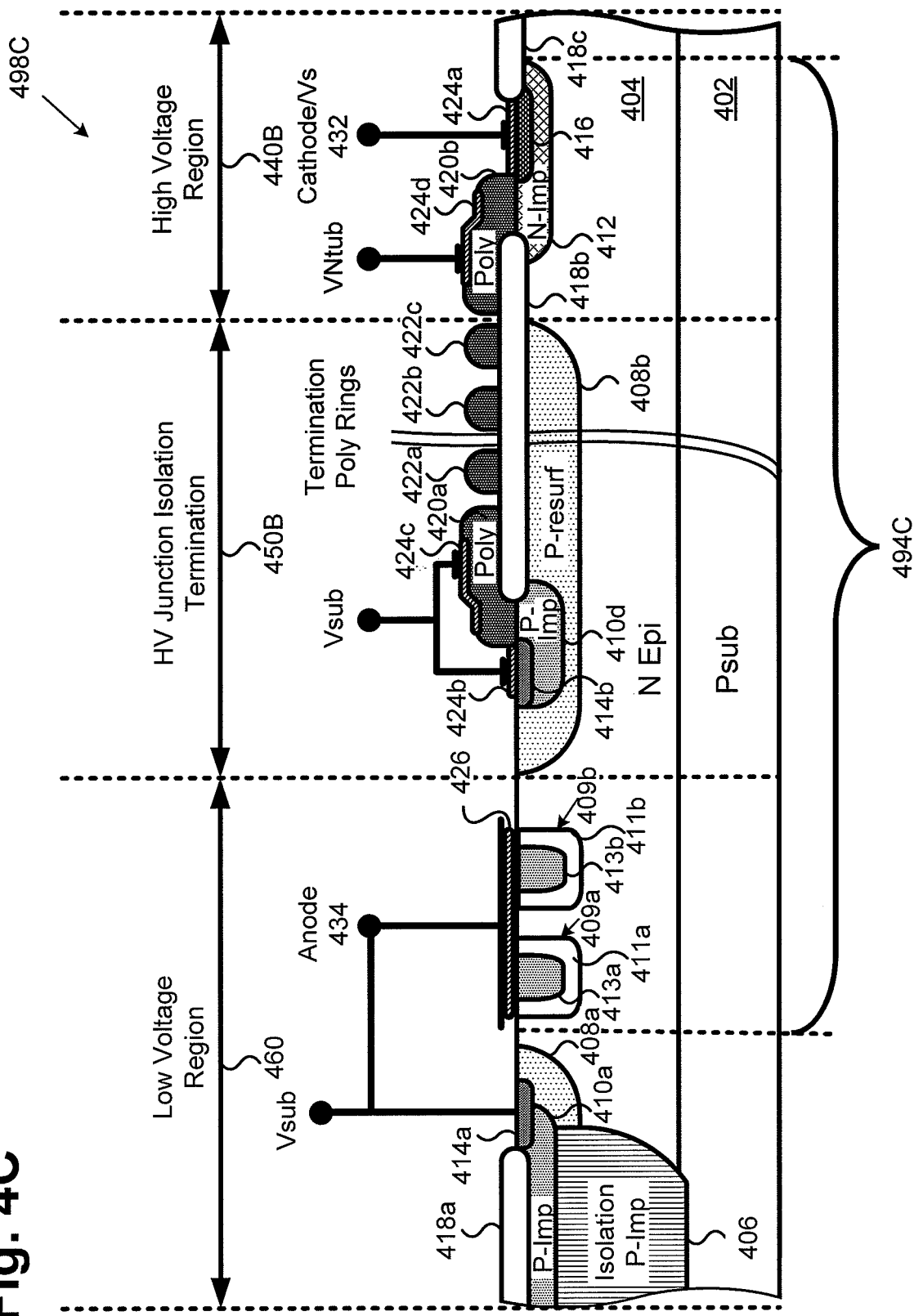
FIG. 4C illustrates a cross sectional view of an exemplary monolithically integrated voltage clamping Schottky diode, according to one implementation of the present application.

Referring to FIG. 4C, FIG. 4C illustrates a cross sectional view of an exemplary monolithically integrated voltage clamping Schottky diode, according to one implementation of the present application. With similar numerals representing similar features in semiconductor die 498B in FIG. 4B, semiconductor die 498C includes P-type substrate 402, N-type epitaxial layer 404, P-type isolation region 406, P-type RESURF regions 408a and 408b, P-type implant regions 410a and 410d, N-type implant region 412, P-type contact regions 414a and 414b, N-type cathode contact region 416, field oxide regions 418a, 418b and 418c, low-voltage tie region 420a, high-voltage tie region 420b, termination rings 422a, 422b and 422c, cathode ohmic layer 424a, ohmic layers 424b, 424c and 424d, anode Schottky barrier 426, anode terminal 434, and cathode terminal 432.

In contrast to voltage clamping Schottky diode 494B in semiconductor die 498B shown in FIG. 4B, voltage clamping Schottky diode 494C in FIG. 4C is a trench metal-oxide-semiconductor barrier Schottky (TMBS) diode. Thus, instead of having P-type implant regions 410b and 410c under anode Schottky barrier 426 to form a junction barrier Schottky (JBS) diode in FIG. 4B, voltage clamping Schottky diode 494C in FIG. 4C includes trenches 409a and 409b under anode Schottky barrier 426, where trench 409a includes conductive filler 413a in dielectric liner 411a, and trench 409b includes conductive filler 413b in dielectric liner 411b. The fabrication process of forming trenches 409a and 409b, as well as conductive fillers 413a and 413b, can be well controlled to reduce the dimensions of trenches 409a and 409b and conductive fillers 413a and 413b in N-type epitaxial layer 404, thereby saving space on semiconductor die 498C. Also, trenches 409a and 409b can better limit the leakage current of voltage clamping Schottky diode 494C under anode Schottky barrier 426, since the distance between trenches 409a and 409b can be better controlled as compared to ion implanted regions in junction barrier Schottky diodes. Similar to voltage clamping Schottky diode 494B in FIG. 4B, voltage clamping Schottky diode 494C in FIG. 4C has a reverse voltage blocking capability of at least 600 volts, and a switching frequency of at least 100 kHz.

Figure 5:
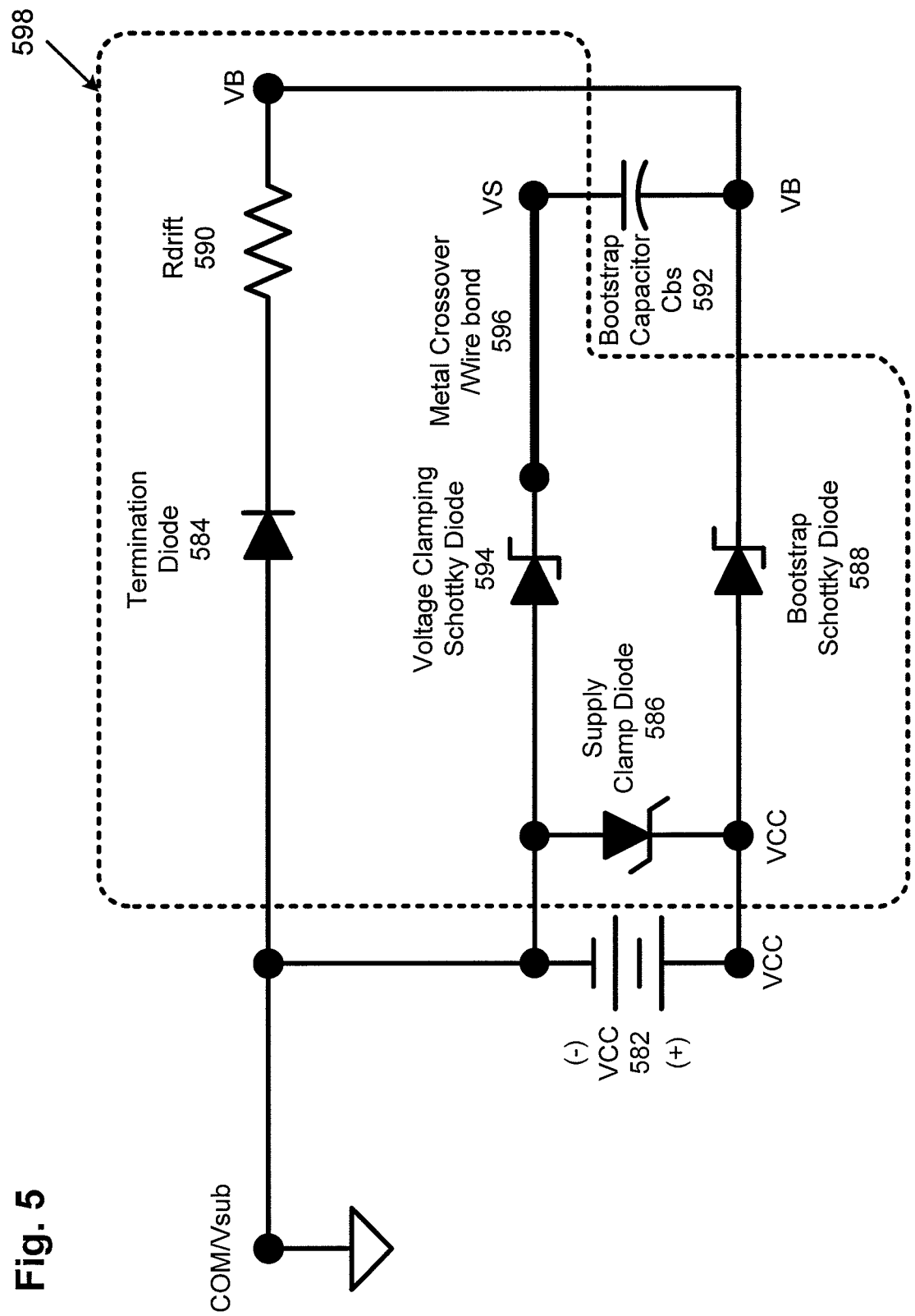
FIG. 5 illustrates an exemplary chip level schematic circuit diagram of a portion of an HVIC having a monolithically integrated voltage clamping Schottky diode and a monolithically integrated bootstrap Schottky diode, according to one implementation of the present application.

Referring to FIG. 5, FIG. 5 illustrates an exemplary chip level schematic circuit diagram of a portion of an HVIC having a monolithically integrated voltage clamping Schottky diode and a monolithically integrated bootstrap Schottky diode, according to one implementation of the present application. In the present implementation, FIG. 5 illustrates a chip level schematic circuit diagram of a portion of circuit 100 in FIG. 1A. With similar numerals representing similar features in FIG. 1A, as illustrated in FIG. 5, termination diode 584, supply clamp diode 586, bootstrap Schottky diode 588 and voltage clamping Schottky diode 594 are monolithically integrated in semiconductor die 598. In addition, power supply VCC 582 is coupled to semiconductor die 598 between positive terminal VCC(+) and negative terminal VCC(−). Bootstrap capacitor (Cbs) 592 is an external capacitor coupled to semiconductor die 598 between switched node VS and terminal VB.

As illustrated in FIG. 5, termination diode 584 and parasitic drift resistance 590 are connected in series, and coupled between negative terminal VCC(−) of power supply VCC 582 and terminal VB. The anode of termination diode 584 is coupled to VCC(−) of power supply VCC 582, and the cathode of termination diode 584 is coupled to bootstrap capacitor (Cbs) 592 at terminal VB. Parasitic drift resistance 590 may be present between the cathode of termination diode 584 and terminal VB in semiconductor die 598. Bootstrap capacitor (Cbs) 592 is coupled between the cathode of bootstrap Schottky diode 588 at terminal VB and switched node VS. Supply clamp diode 586 is coupled in parallel with power supply VCC 582, where the anode of supply clamp diode 586 is coupled to negative terminal VCC(−) of power supply VCC 582, while the cathode of supply clamp diode 586 is coupled to positive terminal VCC(+) of power supply VCC 582. In the present implementation, the anode of termination diode 584, the anode of supply clamp diode 586, the anode of voltage clamping Schottky diode 594, and negative terminal VCC(−) are coupled to common ground node COM/Vsub, which may be a substrate voltage of semiconductor die 598.

As illustrated in FIG. 5, bootstrap Schottky diode 588 is coupled between positive terminal VCC(+) of power supply VCC 582 and terminal VB. The anode of bootstrap Schottky diode 588 is coupled to positive terminal VCC(+) of power supply VCC 582, and the cathode of bootstrap Schottky diode 588 is coupled to bootstrap capacitor (Cbs) 592 at terminal VB. Bootstrap capacitor (Cbs) 592 is coupled between the cathode of bootstrap Schottky diode 588 and switched node VS, where the cathode of voltage clamping Schottky diode 594 is coupled to switched node VS through metal crossover or wire bond 596.

As illustrated in FIG. 5, voltage clamping Schottky diode 594 is a monolithically integrated Schottky diode coupled between negative terminal VCC(−) of power supply VCC and switched node VS. The anode of voltage clamping Schottky diode 594 is coupled to negative terminal VCC(−) of power supply VCC 582, and the cathode of voltage clamping Schottky diode 594 is coupled to switched node VS through metal crossover or wire bond 596. Voltage clamping Schottky diode 594 is configured to turn ON to supply current to switched node VS, when the voltage at switched node VS drops below zero. As such, voltage clamping Schottky diode 594 is configured to prevent the voltage at switched node VS from becoming negative.

As illustrated in FIG. 5, bootstrap Schottky diode 588 is a monolithically integrated Schottky diode coupled between positive terminal VCC(+) of power supply VCC 582 and terminal VB. The anode of bootstrap Schottky diode 588 is coupled to positive terminal VCC(+) of power supply VCC 582, and the cathode of bootstrap Schottky diode 588 is coupled to terminal VB. Bootstrap Schottky diode 588 is configured to charge bootstrap capacitor (Cbs) 592 from positive terminal VCC(+) of power supply VCC 582. When a high voltage is applied to switched node VS, the voltage at switched node VS exceeds the voltage of positive terminal VCC(+) of power supply VCC 582 with the help of bootstrap capacitor (Cbs) 592, bootstrap Schottky diode 588 is in a reverse blocking state, while switched node VS attempts to supply power to a circuit on the high voltage side through bootstrap Schottky diode 588.

Figure 6:
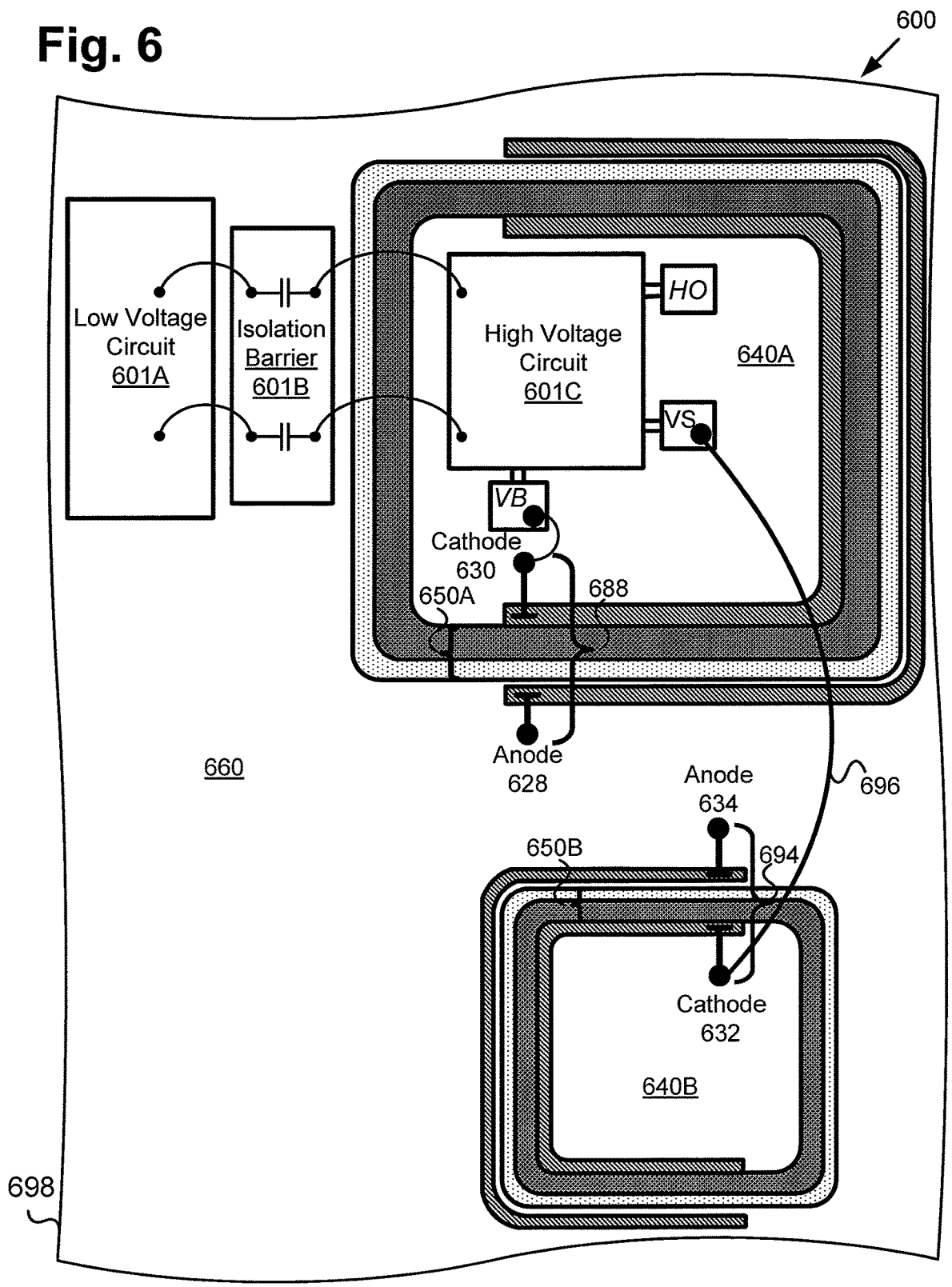
FIG. 6 illustrates an exemplary chip layout diagram of an HVIC having a monolithically integrated voltage clamping Schottky diode and a monolithically integrated bootstrap Schottky diode, according to one implementation of the present application.

Referring to FIG. 6, FIG. 6 illustrates an exemplary chip layout diagram of an HVIC having a monolithically integrated voltage clamping Schottky diode and a monolithically integrated bootstrap Schottky diode, according to one implementation of the present application. With similar numerals representing similar features in FIG. 1A, chip layout diagram 600 in FIG. 6 includes low voltage circuit 601A in low voltage region 660, capacitive isolation barrier 601B in low voltage region 660, high voltage circuit 601C in high voltage region 640A, where low voltage region 660 is monolithically integrated with high voltage regions 640A and 640B in semiconductor die 698. High voltage region 640A is structurally isolated from low voltage region 660 by high voltage junction isolation termination (HVJIT) 650A. Low voltage circuit 601A is coupled to high voltage circuit 601C through capacitive isolation barrier 601B, where low voltage circuit 601A, capacitive isolation barrier 601B and high voltage circuit 601C are part of an HVIC, such as HVIC 101 in FIG. 1A. High voltage region 640B is situated laterally adjacent to high voltage region 640A, and monolithically integrated with low voltage region 660 in semiconductor die 698. High voltage region 640B is structurally isolated from low voltage region 660 by high voltage junction isolation termination (HVJIT) 650B.

As illustrated in FIG. 6, bootstrap Schottky diode 688 is a monolithically integrated in semiconductor die 698 along HVJIT 650A. Anode terminal 628 of bootstrap Schottky diode 688 is situated in low voltage region 660 along the outer perimeters of HVJIT 650A. In the present implementation, anode terminal 628 is coupled to, for example, positive terminal VCC(+) of power supply VCC, not explicitly shown in FIG. 6. Cathode terminal 630 of bootstrap Schottky diode 688 is situated in high voltage region 640A along the inner perimeters of HVJIT 650A. In the present implementation, cathode terminal 630 is coupled to terminal VB of high voltage circuit 601C. Bootstrap Schottky diode 688 is configured to charge a bootstrap capacitor, such as bootstrap capacitor (Cbs) 192 in FIG. 1B, at terminal VB.

In the present implementation, HVJIT 650A includes reduced a surface field (RESURF) region and termination rings, similar to P-type surface field (RESURF) region 208*b* and termination rings 222 in FIG. 2A. In the present implementation, bootstrap Schottky diode 688 is formed along the top, right and bottom sides of HVJIT 650A. In another implementation, bootstrap Schottky diode 688 may be monolithically integrated along all four sides of HVJIT 650A. It should be understood that bootstrap Schottky diode 688 may be substantially similar to bootstrap Schottky diode 288 described with respect to FIGS. 2A through 2C above.

As illustrated in FIG. 6, voltage clamping Schottky diode 694 is a monolithically integrated in semiconductor die 698 along HVJIT 650B. As illustrated in FIG. 6, anode terminal 634 of voltage clamping Schottky diode 694 is situated in low voltage region 660 along the outer perimeters of HVJIT 650B. In the present implementation, anode terminal 634 is coupled to, for example, common ground node COM/Vsub, not explicitly shown in FIG. 6. Cathode terminal 632 of voltage clamping Schottky diode 694 is situated in high voltage region 640B along the inner perimeters of HVJIT 650B. In the present implementation, cathode terminal 632 is coupled to terminal VS of high voltage circuit 601C in high voltage region 640A through metal crossover or wire bond 696. Voltage clamping Schottky diode 694 is configured to turn ON to supply current to switched node VS, when the voltage at switched node VS drops below zero. As such, voltage clamping Schottky diode 694 is configured to prevent the voltage at switched node VS from becoming negative.

In the present implementation, HVJIT 650B includes a reduced surface field (RESURF) region and termination rings, similar to P-type reduced surface field (RESURF) region 408*b* and termination rings 422 in FIG. 4A. Voltage clamping Schottky diode 694 is formed along the top, left and bottom sides of HVJIT 650B. In another implementation, voltage clamping Schottky diode 694 may be monolithically integrated along all four sides of HVJIT 650B. It should be understood that voltage clamping Schottky diode 694 may be substantially similar to voltage clamping Schottky diode 494 described with respect to FIGS. 4A through 4C above.

Figure 7A:
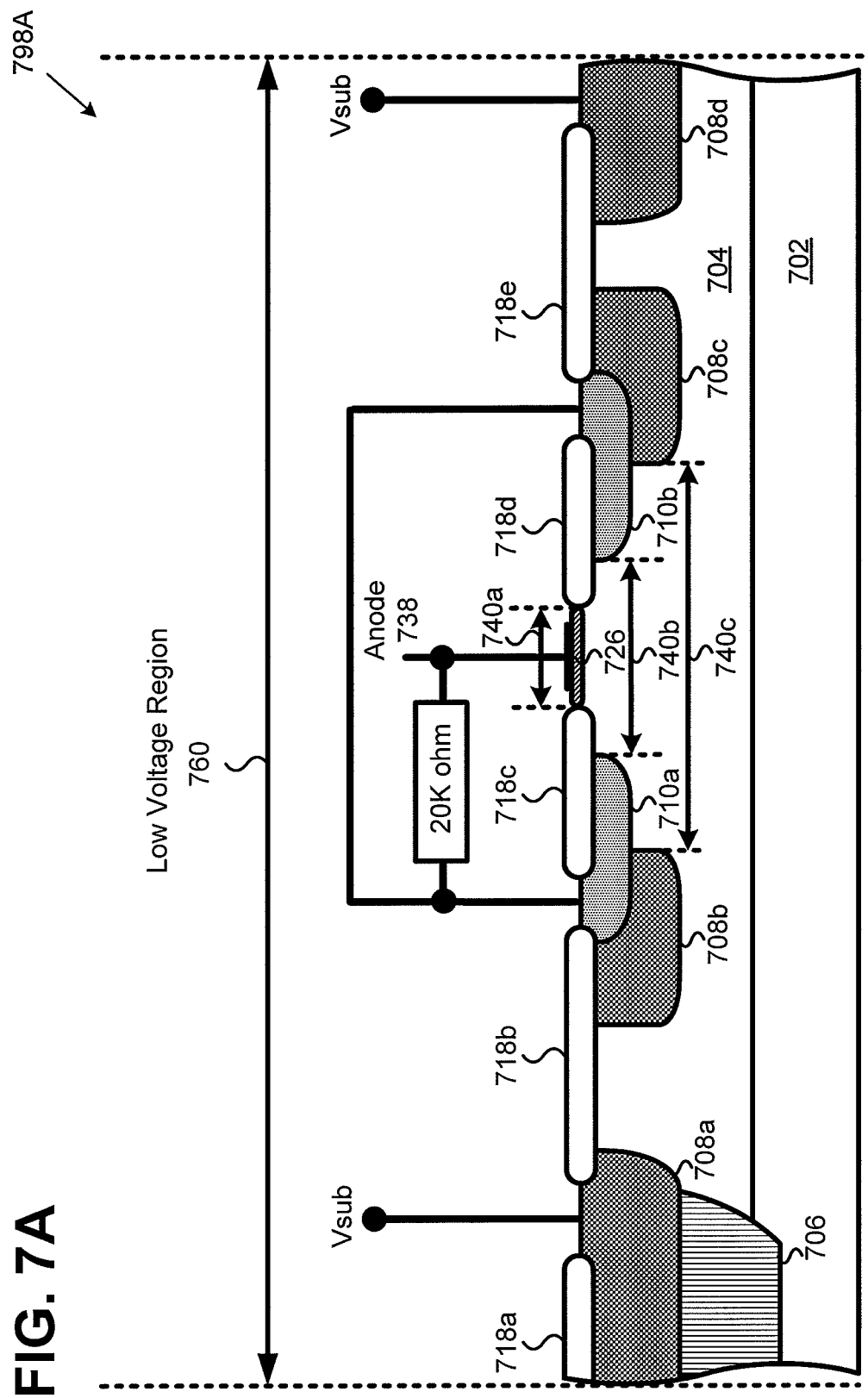
FIG. 7A illustrates a cross sectional view of a portion of a monolithically integrated bootstrap Schottky diode or a monolithically integrated voltage clamping Schottky diode, according to one implementation of the present application.

Referring to FIG. 7A, FIG. 7A illustrates a cross sectional view of a portion of a monolithically integrated bootstrap Schottky diode or a monolithically integrated voltage clamping Schottky diode, according to one implementation of the present application. In the present implementation, FIG. 7A illustrates a cross sectional view of an anode of a monolithically integrated bootstrap Schottky diode or a monolithically integrated voltage clamping Schottky diode. As illustrated in FIG. 7A, semiconductor die 798A includes P-type substrate 702, N-type epitaxial layer 704, P-type isolation region 706, P-type RESURF regions 708*a*, 708*b*, 708*c* and 708*d*, P-type implant regions 710*a* and 710*b*, field oxide regions 718*a*, 718*b*, 718*c*, 718*d* and 718*e*, anode Schottky barrier 726, and anode terminal 738.

As illustrated in FIG. 7A, anode Schottky barrier 726 is formed directly on the top surface of N-type epitaxial layer 704 between field oxide regions 718*c* and 718*d*. Anode Schottky barrier 726 has width 740*a* (e.g., 1 micron), which is the lateral distance between opposing edges of field oxide regions 718*c* and 718*d*. P-type implant regions 710*a* and 710*b* are formed in N-type epitaxial layer 704, and situated symmetrically on each side of anode Schottky barrier 726, where P-type implant regions 710*a* and 710*b* are separated by width 740*b* (e.g., 2 microns). As illustrated in FIG. 7A, P-type implant region 710*a* is situated partially under field oxide region 718*c*, and has a partially exposed top surface on semiconductor die 798A. P-type implant region 710*b* is situated partially under field oxide region 718*d*, and has a partially exposed top surface on semiconductor die 798A. P-type implant regions 710*a* and 710*b* are configured to reduce leakage current under anode Schottky barrier 726.

P-type RESURF regions 708*b* and 708*c* are formed in N-type epitaxial layer 704, and situated symmetrically on each side of anode Schottky barrier 726, where P-type RESURF regions 708b and 708c are separated by width 740c (e.g., 4 microns). P-type RESURF region 708b is situated partially under field oxide region 718b, and partially under P-type implant region 710a. P-type RESURF region 708c is situated partially under field oxide region 718e, and partially under P-type implant region 710b. P-type RESURF regions 708b and 708c are configured to further reduce leakage current under anode Schottky barrier 726.

Also, as illustrated in FIG. 7A, P-type implant regions 710a and 710b are shorted together, and connected to anode terminal 738 through a 20000-ohm resister. This arrangement makes sure that the voltages at P-type implant regions 710a and 710b do not exceed the voltage at anode terminal 738. As such, P-type implant region 710a and N-type epitaxial layer 704 and P-type implant region 710b and N-type epitaxial layer 704 cannot become forward biased at the their respective p-n junctions.

It should be understood that, for an bootstrap Schottky barrier diode, anode terminal 738 is coupled to positive terminal VCC(+) of power supply VCC as illustrated in FIG. 1A, for example. It should also be understood that, for a voltage clamping Schottky diode, anode terminal 738 is coupled to common ground node COM/Vsub as illustrated in FIG. 1A, for example.

Figure 7B:
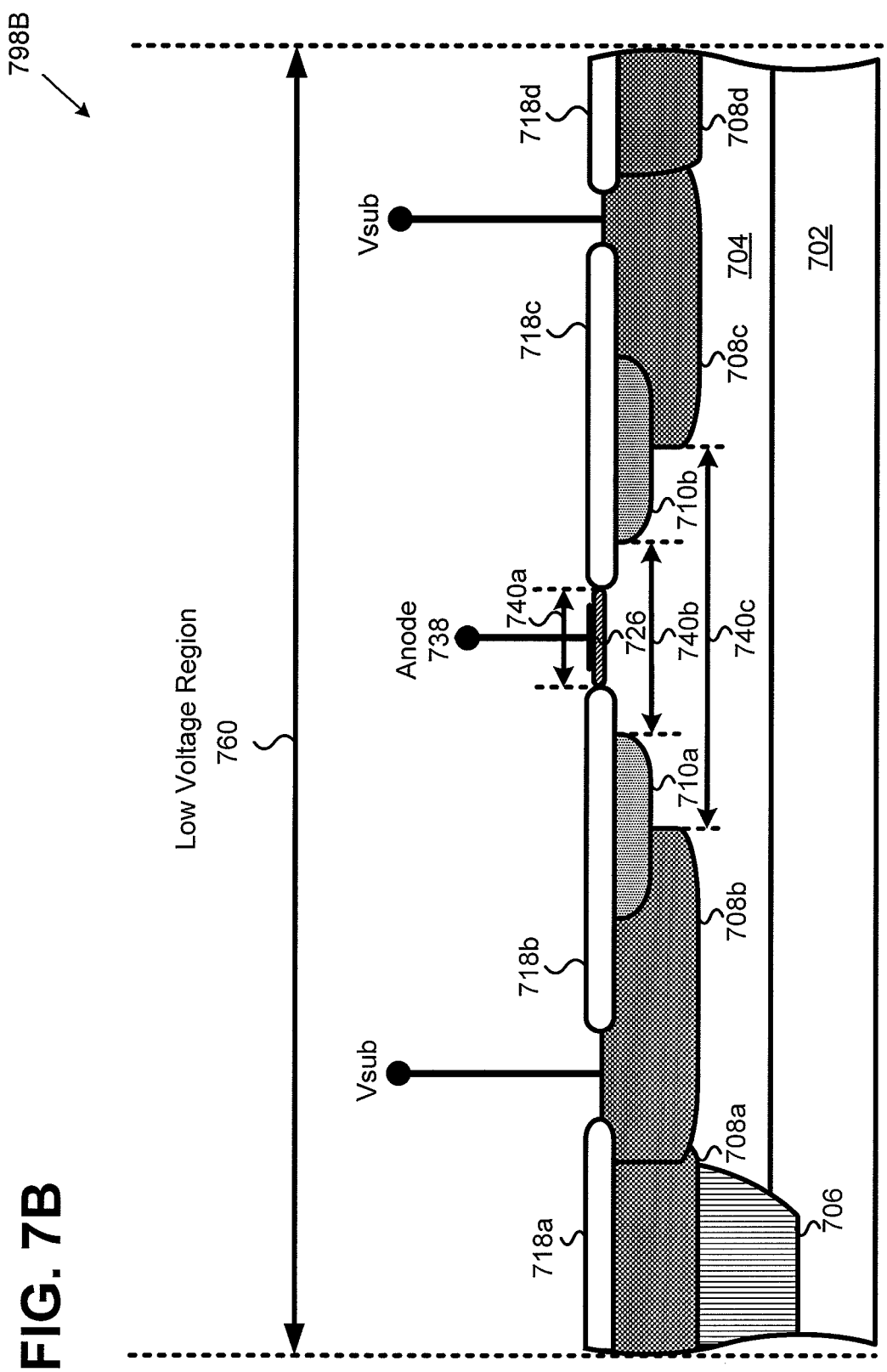
FIG. 7B illustrates a cross sectional view of a portion of a monolithically integrated bootstrap Schottky diode or a monolithically integrated voltage clamping Schottky diode, according to one implementation of the present application.

Referring to FIG. 7B, FIG. 7B illustrates a cross sectional view of a portion of a monolithically integrated bootstrap Schottky diode or a monolithically integrated voltage clamping Schottky diode, according to one implementation of the present application. In the present implementation, FIG. 7B illustrates a cross sectional view of an anode of a monolithically integrated bootstrap Schottky diode or a monolithically integrated voltage clamping Schottky diode. As illustrated in FIG. 7B, semiconductor die 798B includes P-type substrate 702, N-type epitaxial layer 704, P-type isolation region 706, P-type RESURF regions 708a, 708b, 708c and 708d, P-type implant regions 710a and 710b, field oxide regions 718a, 718b, 718c and 718d, anode Schottky barrier 726, and anode terminal 738.

As illustrated in FIG. 7B, anode Schottky barrier 726 is formed directly on the top surface of N-type epitaxial layer 704 between field oxide regions 718b and 718c. Anode Schottky barrier 726 has width 740a (e.g., 1 micron), which is the lateral distance between opposing edges of field oxide regions 718b and 718c. P-type implant regions 710a and 710b are formed in N-type epitaxial layer 704, and situated symmetrically on each side of anode Schottky barrier 726, where P-type implant regions 710a and 710b are separated by width 740b (e.g., 2 microns). As illustrated in FIG. 7A, P-type implant region 710a is entirely situated under field oxide region 718b. P-type implant region 710b is entirely situated under field oxide region 718c. P-type implant regions 710a and 710b are configured to reduce leakage current under anode Schottky barrier 726.

P-type RESURF regions 708b and 708c are formed in N-type epitaxial layer 704, and situated symmetrically on each side of anode Schottky barrier 726, where P-type RESURF regions 708b and 708c are separated by width 740c (e.g., 4 microns). P-type RESURF region 708b is situated partially under field oxide region 718b, and partially under P-type implant region 710a. P-type RESURF region 708b also has a partially exposed top surface on semiconductor die 798A. P-type RESURF region 708c is situated partially under field oxide region 718e, and partially under P-type implant region 710b. P-type RESURF region 708c also has a partially exposed top surface on semiconductor die 798A. P-type RESURF regions 708b and 708c are configured to further reduce leakage current under anode Schottky barrier 726.

Also, as illustrated in FIG. 7A, P-type RESURF regions 708a and 708b are merged together in N-type epitaxial layer 704, where P-type RESURF region 708a is situated under field oxide region 718a and coupled to P-type substrate 702 through P-type isolation region 706. P-type RESURF regions 708c and 708d are merged together in N-type epitaxial layer 704, where P-type RESURF region 708d is situated under field oxide region 718d.

It should be understood that, for an bootstrap Schottky barrier diode, anode terminal 738 is coupled to positive terminal VCC(+) of power supply VCC as illustrated in FIG. 1A, for example. It should also be understood that, for a voltage clamping Schottky diode, anode terminal 738 is coupled to common ground node COM/Vsub as illustrated in FIG. 1A, for example. It should be understood that the bootstrap Schottky barrier diodes and voltage clamping Schottky diodes would also function properly if the polarities of each of the abovementioned regions are reversed.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A Schottky diode, comprising:
   a cathode terminal in a high voltage region of a semiconductor die, said high voltage region comprising an N-type implant region formed in an N-type epitaxial layer, said N-type implant region being electrically coupled to said cathode terminal;
   an anode terminal in a low voltage region of said semiconductor die, said low voltage region comprising a first P-type reduced surface field (RESURF) region formed in said N-type epitaxial layer and a P-type isolation region extending into a P-type substrate disposed below said N-type epitaxial layer; and
   a junction isolation termination situated between said high voltage region and said low voltage region, said junction isolation termination comprising a second P-type RESURF region formed in said N-type epitaxial layer and structurally isolating said low voltage region from said high voltage region, said junction isolation termination configured to withstand a reverse bias voltage of at least 600 volts when said Schottky diode is under reverse bias.

2. The Schottky diode of claim 1, wherein said Schottky diode comprises a junction barrier Schottky diode.

3. The Schottky diode of claim 1, wherein said Schottky diode comprises a trench metal-oxide-semiconductor (MOS) Schottky diode.

4. The Schottky diode of claim 1, wherein said junction isolation termination comprises pzener rings.

5. The Schottky diode of claim 1, wherein said Schottky diode comprises a bootstrap diode configured to charge a bootstrap capacitor.

6. The Schottky diode of claim 1, wherein said Schottky diode comprises a voltage clamping diode.

7. The Schottky diode of claim 1, wherein said semiconductor die comprises:
a Schottky barrier situated on said N-type epitaxial layer in said low voltage region, and coupled to said anode terminal.

8. The Schottky diode of claim 7, wherein said semiconductor die further comprises two implanted P-type regions under said Schottky barrier.

9. The Schottky diode of claim 7, wherein said semiconductor die further comprises two metal-oxide-semiconductor trenches under said Schottky barrier.

10. The Schottky diode of claim 1, wherein a complete conduction path of the Schottky diode between the anode terminal and the cathode terminal is provided by a Schottky barrier and a semiconductor portion, wherein the Schottky barrier is disposed at the surface of said semiconductor die in the low voltage region, and wherein the semiconductor portion extends from the Schottky barrier to the cathode terminal and is exclusively provided from N-type semiconductor material.

11. A high voltage integrated circuit (HVIC), comprising:
a high voltage circuit in a high voltage region of a semiconductor die;
a low voltage circuit in a low voltage region of said semiconductor die;
a junction isolation termination situated between said high voltage region and said low voltage region; and
a Schottky diode monolithically integrated in said semiconductor die, wherein said Schottky diode comprises a cathode terminal in said high voltage region, and an anode terminal in said low voltage region.

12. The HVIC of claim 11, wherein said Schottky diode comprises a junction barrier Schottky diode.

13. The HVIC of claim 11, wherein said Schottky diode comprises a trench metal-oxide-semiconductor (MOS) Schottky diode.

14. The HVIC of claim 11, wherein said Schottky diode comprises a bootstrap diode configured to charge a bootstrap capacitor of said HVIC.

15. The HVIC of claim 11, wherein said semiconductor die comprises:
a substrate of a first conductivity type;
an epitaxial layer of a second conductivity type situated on said substrate; and
a Schottky barrier situated on said epitaxial layer in said low voltage region, and coupled to said anode terminal.

16. The HVIC of claim 15, wherein said semiconductor die further comprises two implanted regions of said first conductivity under said Schottky barrier.

17. The HVIC of claim 15, wherein said semiconductor die further comprises two metal-oxide-semiconductor trenches under said Schottky barrier.

18. The HVIC of claim 11, further comprising a Schottky voltage clamping diode monolithically integrated in said semiconductor die.

19. The HVIC of claim 18, wherein said Schottky voltage clamping diode comprises a cathode terminal in another high voltage region, and an anode terminal in said low voltage region, said another high voltage region being isolated from said low voltage region by another junction isolation termination.

20. The HVIC of claim 11, wherein a complete conduction path of the Schottky diode between the anode terminal and the cathode terminal is provided by a Schottky barrier and a semiconductor portion, wherein the Schottky barrier is disposed at the surface of said semiconductor die in the low voltage region, and wherein the semiconductor portion extends from the Schottky barrier to the cathode terminal and is exclusively provided from N-type semiconductor material.

* * * * *